(12) United States Patent
Rantala et al.

(10) Patent No.: US 7,473,650 B2
(45) Date of Patent: Jan. 6, 2009

(54) POLY(ORGANOSILOXANE) MATERIALS AND METHODS FOR HYBRID ORGANIC-INORGANIC DIELECTRICS FOR INTEGRATED CIRCUIT APPLICATIONS

(75) Inventors: Juha T. Rantala, Helsinki (FI); Jason S. Reid, Los Gatos, CA (US); T. Teemu T. Tormanen, Espoo (FI); Nungavram S. Viswanathan, San Jose, CA (US); Arto L. T. Maaninen, Oulu (FI)

(73) Assignee: Silecs Oy, Espoo (FI)

( * ) Notice: Subject to any disclaimer, the term of this patent is extended or adjusted under 35 U.S.C. 154(b) by 1 day.

(21) Appl. No.: 11/606,941

(22) Filed: Dec. 1, 2006

(65) Prior Publication Data

US 2007/0077779 A1    Apr. 5, 2007

Related U.S. Application Data

(62) Division of application No. 10/346,539, filed on Jan. 17, 2003, now Pat. No. 7,144,827.

(60) Provisional application No. 60/414,578, filed on Sep. 27, 2002, provisional application No. 60/395,418, filed on Jul. 13, 2002, provisional application No. 60/349,955, filed on Jan. 17, 2002, provisional application No. 60/349,873, filed on Jan. 17, 2002, provisional application No. 60/349,734, filed on Jan. 17, 2002.

(51) Int. Cl.
*H01L 21/31* (2006.01)
*H01L 21/469* (2006.01)

(52) U.S. Cl. .................. 438/778; 438/780; 562/405

(58) Field of Classification Search ............... 438/778, 438/780, 784, 789, 790; 562/405, 468, 490
See application file for complete search history.

(56) References Cited

U.S. PATENT DOCUMENTS 5,534,614 A * 7/1996 O'Briem et al. ............. 528/183
5,686,549 A * 11/1997 Grainger et al. ............. 528/25
6,911,518 B2   6/2005 Lichtenhan et al. .......... 528/15

* cited by examiner

*Primary Examiner*—Phuc T Dang
(74) *Attorney, Agent, or Firm*—Kubovcik & Kubovcik

(57) ABSTRACT

A method for making an integrated circuit is disclosed as comprising depositing alternating regions of electrically conductive and dielectric materials on a substrate, wherein an area of dielectric material is formed by: a silane precursor having a fully or partially fluorinated first organic group comprising an unsaturated carbon-carbon double bond, the fully or partially fluorinated organic group bound to silicon in the silane precursor; forming from the silane precursor a hybrid organic-inorganic material having a molecular weight of at least 500 on a substrate; and increasing the molecular weight of the hybrid material by exposure to heat, electromagnetic radiation or electron beam so as to break the unsaturated carbon-carbon double bond and cross link via the fully or partially fluorinated organic group. Also disclosed is a method for making an integrated circuit is disclosed as comprising: reacting a compound of the general formula X3MOR3₃, where X3 is a halogen, M is silicon, and OR3 is alkoxy; with a compound of the general formula R1M1; where R1 is selected from alkyl, alkenyl, aryl and alkynyl and wherein R1 is partially or

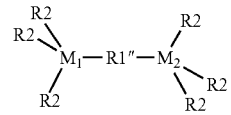

fully fluorinated; and M1 is an element from group I of the periodic table; so as to form a compound of the general formula R1MOR3₃; hydrolyzing and condensing R1MOR3₃ so as to form a hybrid organic-inorganic material with a molecular weight of at least 500; depositing the hybrid organic-inorganic material on a substrate as an insulator in an integrated circuit; depositing, before or after depositing the hybrid material, an electrically conductive material within the integrated circuit.

1 Claim, 6 Drawing Sheets

US 7,473,650 B2

POLY(ORGANOSILOXANE) MATERIALS AND METHODS FOR HYBRID ORGANIC-INORGANIC DIELECTRICS FOR INTEGRATED CIRCUIT APPLICATIONS

This application is a divisional of U.S. patent application Ser. No. 10/346,539 filed Jan. 17, 2003, which will issue as U.S. Pat. No. 7,144,827, which claims priority under 35 USC 119 of U.S. provisional patent applications 60/349,955 filed Jan. 17, 2002; 60/395,418 filed Jul. 13, 2002; 60/414,578 filed Sep. 27, 2002; 60/349,873 filed Jan. 17, 2002; and 60/349,734 filed Jan. 17, 2002; each incorporated herein by reference in their entirety.

BACKGROUND OF THE INVENTION

The present invention generally relates to methods for making dielectrics for integrated circuit processes and devices. More particularly, the invention relates to multi-level circuit processes, such as damascene processes that utilize metal and metal alloys (e.g., copper and copper alloys) as well as low-k dielectric materials. The methods of the present invention allow for greater control of the dielectric fabrication process.

Built on a semiconducting substrate, integrated circuits comprise of millions of transistors and other devices which communicate electrically with one another and outside packaging material through multiple levels of vertical and horizontal wiring embedded in a dielectric material. Within the multilayer metallization structure, "vias" comprise the vertical wiring, whereas "interconnects" comprise the horizontal wiring. Fabricating the metallization can involve the successive depositing and patterning of multiple layers of dielectric and metal to achieve electrical connection among transistors and to outside packaging material. The patterning for a given layer is often performed by a multi-step process consisting of layer deposition, photoresist spin, photoresist exposure, photoresist develop, layer etch, and photoresist removal on a substrate. Alternatively, the metal may sometimes be patterned by first etching patterns into a dielectric, filling the pattern with metal, then subsequently chemical mechanical polishing the metal so that the metal remains embedded only in the openings of the dielectric. As an interconnect material, aluminum has been utilized for many years due to its high conductivity (and low cost). Aluminum alloys have also been developed over the years to improve the melting point, diffusion, electromigration and other qualities as compared to pure aluminum. Spanning successive layers of aluminum, tungsten has traditionally served as the conductive via material. Silicon dioxide (dielectric constant of around 4.0) has been the dielectric of choice, used in conjunction with aluminum-based and tungsten-based interconnects and via for many years. The drive to faster microprocessors and more powerful electronic devices in recent years has resulted in very high circuit densities and faster operating speeds, which in turn have required higher conductivity metals and lower-k dielectrics (preferably below 3.0, more preferably below 2.5 dielectric constant). In the past few years, VLSI (and ULSI) processes have been moving to copper damascene processes where copper (or copper alloys) is used for the higher conductance in the conductor lines and spin-on or CVD low-k dielectrics are used for the insulating material surrounding the conductor lines. To circumvent problems with etching, copper along with a barrier metal is blanket deposited over recessed dielectric structures consisting of interconnect and via openings and subsequently polished in a processing method known as "dual damascene." The bottom of the via opening is usually the top of an interconnect from the previous metal layer or in some instances, the contacting layer to the substrate.

FIG. 1 gives an example of a typical process for patterning a dielectric film. First a dielectric layer film 12 is deposited on a wafer substrate 10 typically by spin-on or chemical vapor deposition processes. Next, a removable, photosensitive "photoresist" film 14 is spun onto the wafer substrate 10. Afterward, the photoresist 12 is selectively exposed through a mask which serves as a template for the layer's circuit pattern and is subsequently developed (developer applied to remove either exposed or unexposed areas depending upon the type of resist). The photoresist is typically baked after spin, exposure, and develop. Next, the layer film is etched in a reactive plasma, wet bath, or vapor ambient in regions not covered by the photoresist to define the circuit pattern. Lastly, the photoresist 14 is stripped. The process of layer deposition, photoresist delineation, etching, and stripping is repeated many times during the fabrication process.

Because photoresist may unacceptably erode during the etch process or may not be able to be adequately delineated within device specifications, a hard mask is sometimes inserted between the layer film and the photoresist (the materials of the invention could also be used for making such a hard mask). FIG. 2 illustrates this typical method, which is similar to the dielectric patterning process described previously in relation to FIG. 1. The layer film could be metal, semiconductor, or dielectric material depending on the application. As can be seen in FIG. 2, a substrate 10 is provided on which is deposited a layer film 12. On film 12 is deposited a hard mask 13. On hard mask 13 is deposited a photoresist material 14. The photoresist is exposed and developed so as to selectively expose the underlying hard mask 13. Then, as can be further seen in FIG. 2, the hard mask 13 is etched via the exposed areas in photoresist 12. Thereafter, the photoresist is removed and the dielectric film 12 is etched by using the hard mask 13 as the pattern mask.

The "dual damascene" process used in integrated circuit application combines dielectric etches and sometimes hard masks to form trenches and vias to contain metal interconnects. FIG. 3 demonstrates one implementation of the technique. From the bottom up in FIG. 3a, the stack is made up of a substrate 20, a dielectric film 22, a hard mask 23, a second dielectric film 24, and a patterned photoresist layer 26. After etching and photoresist strip, a dual-width trench feature is formed as shown in FIG. 3b. The openings are then filled with metal and subsequently polished, leaving metal only within the openings.

The procedures shown in FIGS. 1-3 are often repeated many times during integrated circuit application, which adds to the cost of the circuit and degrades yield. Reducing the number of steps, such as implementing a photopatternable dielectric material which obviates the need for photoresist and etching steps, has huge benefits to the circuit manufacturer.

In addition to the dielectric IC material being photopatternable, it is also desirable that the material be easy to deposit or form, preferably at a high deposition rate and at a relatively low temperature. Once deposited or formed, it is desirable that the material be easily patterned, and preferably patterned with small feature sizes if needed. Once patterned, the material should preferably have low surface and/or sidewall roughness. It might also desirable that such materials be hydrophobic to limit uptake of moisture (or other fluids), and be stable with a relatively high glass transition temperature (not degrade or otherwise physically and/or chemically change upon further processing or when in use).

There is a need for improved methods of making dielectric materials. There is a further need for improved methods of making dielectric materials

SUMMARY OF THE INVENTION

The present invention is directed generally to methods for making dielectric materials for semiconductor devices. The invention is directed to utilizing specific precursors so as to reliably control such methods for making the dielectric materials. In one embodiment, particular silanes, preferably those having a single halogen, alkoxy or OH group bound to silicon (with various organic groups, as will be discussed below, being bound in other positions to the silicon).

In one embodiment, the present invention is directed to a method for forming a hybrid organic inorganic layer on a substrate, comprising: hydrolyzing a silane selected from the group consisting of a tetraalkoxysilane, a trialkoxysilane, a trichlorosilane, a dialkoxysilane, and a dichlorosilane, with a compound of the general formula: $R^1R^2R^4MR^5$, wherein $R^1$, $R^2$ and $R^4$ are independently an aryl, alkyl, alkenyl, epoxy or alkynyl group, wherein at least one of $R^1$, $R^2$ and $R^4$ is fully or partially fluorinated, wherein M is selected from group 14 of the periodic table, and wherein $R^5$ is either an alkoxy group, $OR^3$, or a halogen, X. In various embodiments, $OR^3$ can have one to 10 carbons, one to 7 carbons, and more preferably one to five carbons, and the like. In another embodiment of the present invention a compound of the general formula $R^1_{4-m}SiOR^3_m$ wherein m is an integer from 2 to 4, $OR^3$ is an alkoxy, acyl or acyloxy group, is reacted with a compound of the general formula $R^2X^2+Mg$, wherein $X^2$ is Br or I; where $R^1$ and $R^2$ are independently selected from alkyl, alkenyl, aryl, alkynyl or epoxy, and at least one of $R^1$ and $R^2$ is partially or fully fluorinated. A coating compound is made of the general formula $R^2R^1_{4-m}SiOR^3_{m-1}$ with a molecular weight between 3000 and 100,000. This is then followed by reacting $R^2R^1_{4-m}SiOR^3_{m-1}$ with a halogen or halogen compound in order to replace one or more $OR^3$ groups with a halogen. This reaction forms $R^2R^1_{4-m}SiOR^3_{m-1-n}X_n$, where X is a halogen and n is from 1 to 3 and m>n, except where $R^1$ is fluorinated phenyl and $OR^3$ is ethoxy.

In another embodiment of the present invention, precursors, as described above, are used to make fully, partially and non-fluorinated hybrid organic-inorganic siloxane materials (FHOSM) as an interlevel dielectric and/or hard mask in integrated circuit processes and devices. In one embodiment of the invention, the FHOSM takes the place of the typical interlevel dielectric or hard mask films depicted in FIGS. 1-3. Application of the IC material of the invention is performed with spin-on or other deposition processes. Patterning can be accomplished by masking and etching procedures described previously. Or, as in the preferred embodiment of the invention, the sensitivity of FHOSM is utilized to reduce the number of processing steps. Instead of patterning the film with photoresist and etch processes, the film dielectric itself is photopatternable like photoresist. Compared to the standard process depicted in FIG. 1, the photopatternable FHOSM process eliminates several processing steps potentially reducing costs and improving yield. Similar to the photopatternable dielectric concept described in the previous embodiment, a photopatternable FHOSM may be used as a hard mask material for etching semiconductor, dielectric, or metal underlayers. The number of processing steps required to fabricate the feature is reduced with respect conventional processing techniques shown in FIG. 1. And, owing to their "negative" behavior under exposure, photopatternable FHOSM can also be applied to reduce the number of processing steps required to build a dielectric "dual damascene" structure. In addition, to patterning FOSHM by photolithography processes defined previously, exposure by particle beams, such as electron beams, is also possible. Also, the present invention covers use of FOSHM in printed circuit board applications, which are similar to those discussed for integrated circuits.

DESCRIPTION OF THE PREFERRED EMBODIMENTS

In one embodiment of the present invention, hybrid organic-inorganic materials are used for IC applications. In this embodiment, the hybrid materials of the invention can provide the benefits of low dielectric constant, direct patternability, by exposure to light or particle beam, as well as other characteristics such as stability, glass transition temperature, ease of handling and deposition, etc. In this embodiment, the hybrid materials of the can have an inorganic backbone, including but not limited to one that is made of a metal or metalloid oxide three dimensional network, and the like, with organic substituents and cross linking groups, that can be partially or fully fluorinated.

Figure 1:
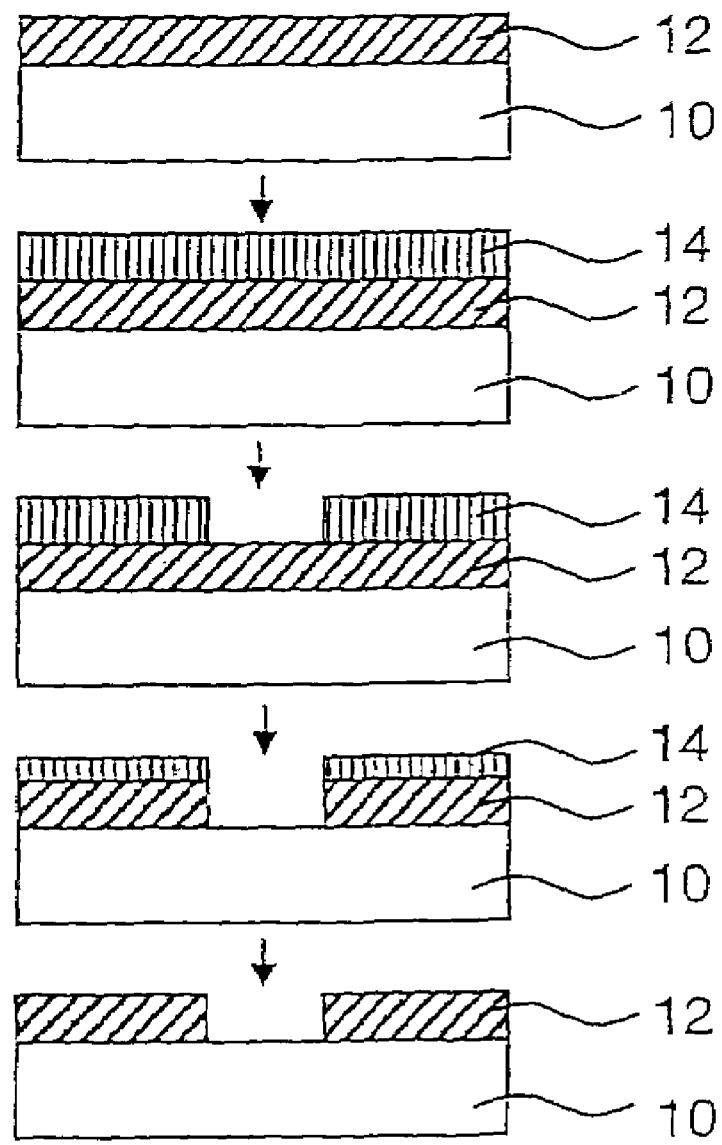
FIG. 1 is a cross-sectional view of a conventional process flow for patterning of dielectric film using conventional processes.
Figure 4:
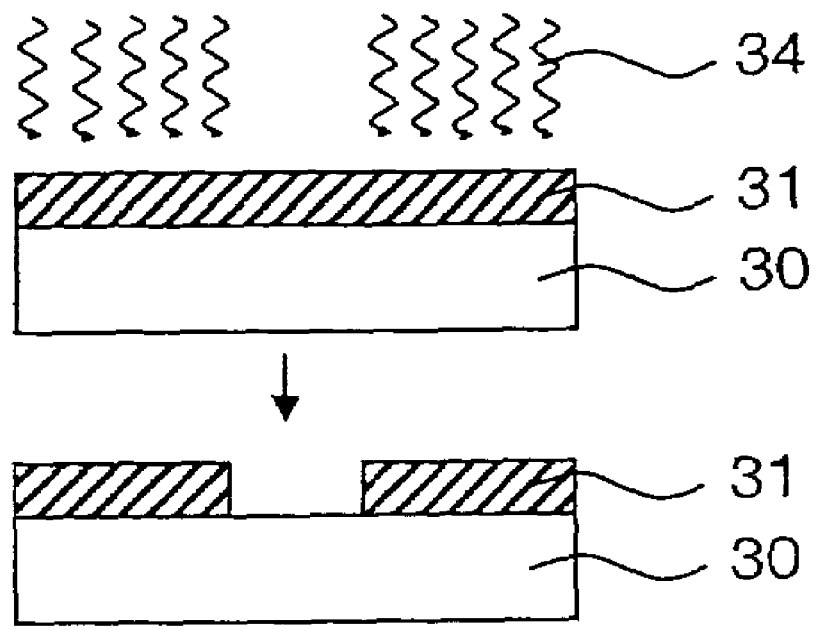
FIG. 4 is an illustration of a cross-sectional process flow of the present invention for patterning FHOSM films. Note the reduction in steps compared to the standard dielectric process depicted in FIG. 1.

In one embodiment of the invention, the photosensitivity of FHOSM is utilized to reduce the number of processing steps. Instead of patterning the film with photoresist and etch processes, the film dielectric itself is photopatternable like photoresist. Compared to the standard process depicted in FIG. 1, the photopatternable FHOSM process eliminates several processing steps potentially reducing costs and improving yield. As can be seen in FIG. 4, in the present invention, a substrate 30 is provided. The substrate 30 can be any suitable substrate, such as a silicon substrate, or a substrate having multiple film layers already deposited thereon. On the substrate is deposited the hybrid material 31 of the present invention. The hybrid material is selectively exposed to electromagnetic energy (e.g., UV light) or particle beam (e.g., electron beam), so as to selectively crosslink exposed areas. Non-exposed areas are removed with a developer, as can be seen in FIG. 4. Similar to photoresist, the material is baked after spin, development, and when applicable, exposure to optimize performance. As can be seen from the above, the additional steps of adding photoresist, developing the photoresist, etching through exposed areas of the photoresist, and final photoresist removal, are not needed in the present invention as compared to the prior art method illustrated in FIG. 1.

Figure 2:
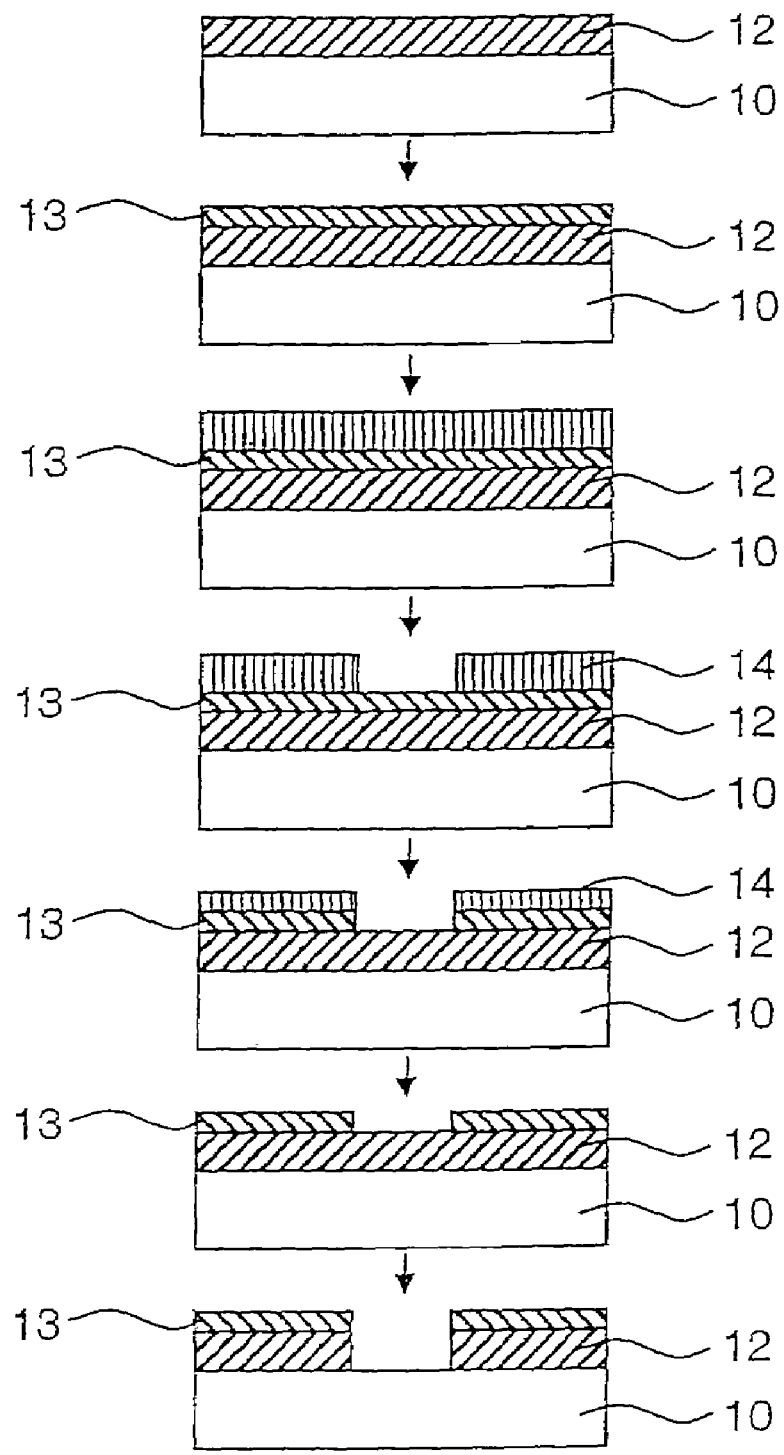
FIG. 2 is a cross-sectional view of a conventional process flow for etching of a layer film through a hard mask. In some processes, the photoresist strip may occur after the film etch.
Figure 3A:
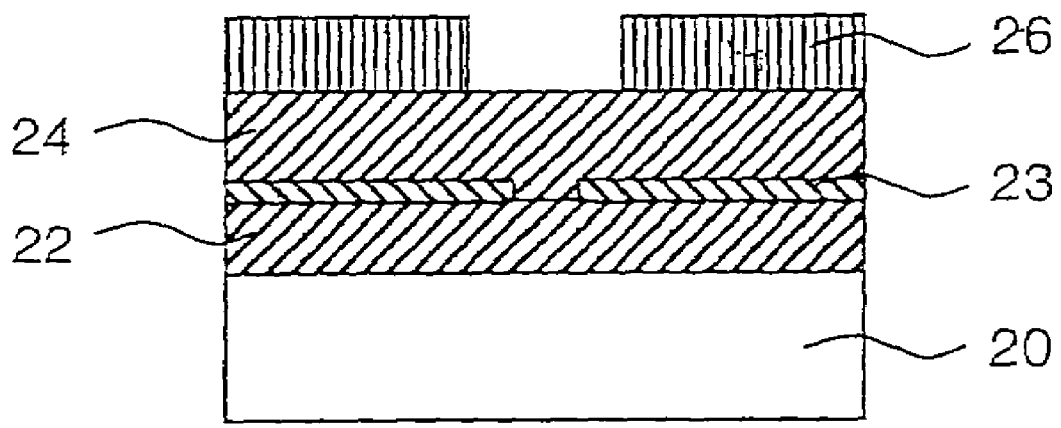
FIG. 3 is an illustration of a damascene structure before (a) and after (b) final etch and photoresist strip.
Figure 3B:
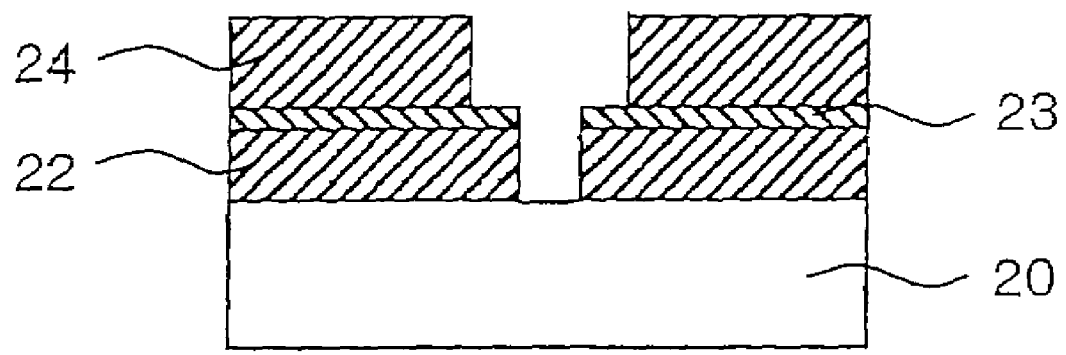
Figure 5:
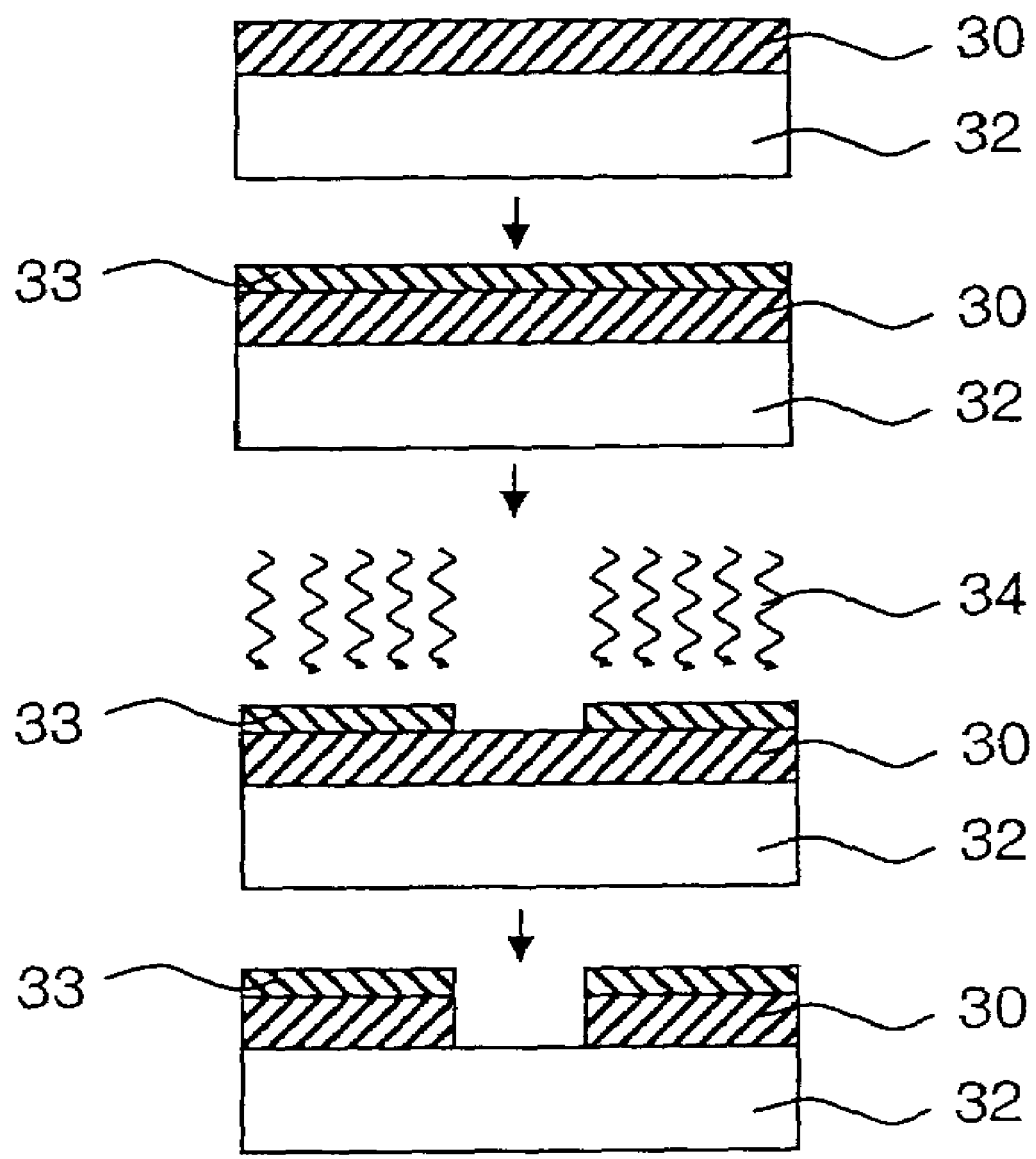
FIG. 5 is a process flow of the present invention for implementing a photopatternable hard mask process using FHOSM. Note the reduction in steps compared to the convention process shown in FIG. 2.

Similar to the photopatternable dielectric concept described in the previous embodiment, a photopatternable hybrid material of the present invention may be used as a hard mask material when etching semiconductor, dielectric, or metal underlayers as shown in FIG. 5. The number of processing steps required to fabricate the feature is reduced with respect conventional processing techniques shown in FIGS. 1 and 2. As can be seen in FIG. 5, a substrate 30 is provided on which is deposited a material to be etched 32 (e.g., metal, dielectric or semiconductor layer). On layer 32 is deposited a hard mask 33 which is formed of the hybrid material of the present invention. The hard mask is selectively exposed to electromagnetic radiation or particle beam 34 followed by removal of non-exposed areas of the mask layer. Finally, the underlying layer 32 is etched via the pattern in the mask layer 33 (with an etch chemistry that is tailored to the material 32 and that will not remove to an appreciable degree mask 33). Etching can be accomplished through ion, vapor, or liquid methods.

Figure 6:
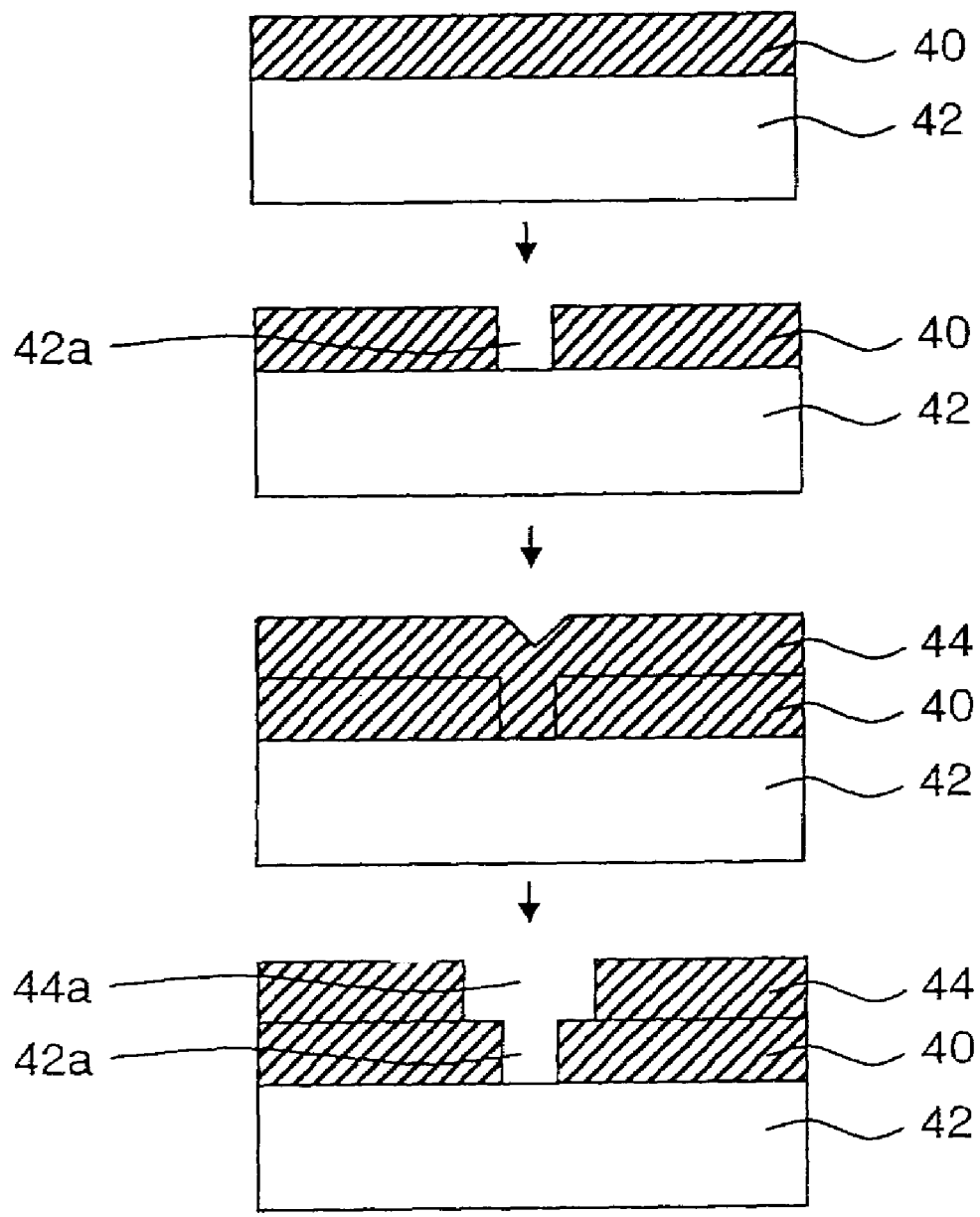
FIG. 6 is a "dual damascene" process flow of the present invention using FHOSM.

Owing to their "negative" behavior under exposure, the photopatternable dielectric materials of the present invention can also be applied to reduce the number of processing steps required to build a dielectric "dual damascene" structure. FIG. 6 illustrates one embodiment of this. First, the hybrid dielectric material is spun on or otherwise deposited as layer 42 on a substrate 40. Then, layer 42 is selectively exposed and developed to define a via 42a. Next, a "trench" layer 44 (also of the hybrid dielectric material of the invention) is deposited e.g., by spin on, exposed, and developed so as to form a trench 44a and reopen via 42a. No hard mask step or etch steps are required. Because of the negative developing characteristics of the material of the invention, the trench exposure needs no compensation to develop out the unexposed via area 44a filled by the material from trench layer 44.

In the above dual damascene example, either "via" layer 42 or "trench" layer 44, or both can be made of the hybrid, preferably photopatternable, material of the invention. Also, it is possible that though both layers 42 and 44 are hybrid materials of the invention, the hybrid material for layer 42 is different than the material for hybrid layer 44 (different inorganic backbone and/or organic groups discussed further below). Also, though a dual damascene example is illustrated in FIG. 6, a "single" damascene or other IC process could be performed—though preferably one that benefits from a photopatternable dielectric. Also, the dielectric materials of the present invention can be used in printed circuit board applications, similar to those discussed above for integrated circuit applications.

COMPOUNDS

In this section, compounds are described that can be hydrolyzed and condensed (alone or with one or more other compounds) into a hybrid material having a molecular weight of from 500 to 100,000. The molecular weight can be in the lower end of this range (e.g., from 500 to 5,000, or more preferably 500 to 3,000) or the hybrid material can have a molecular weight in the upper end of this range (such as from 5,000 to 100,000 or from 10,000 to 50,000). In addition, it may be desirable to mix a hybrid material having a lower molecular weight with a hybrid material having a higher molecular weight. The hybrid material can be suitably deposited such as by spin-on, spray coating, dip coating, or the like. Such compounds are preferably partially or fully fluorinated, though not necessarily so. The compounds will preferably have an element M selected from groups 3-6 or 13-16 of the periodic table, which element is preferably tri-, tetra- or penta-valent, and more preferably tetravalent, such as those elements selected from group 14 of the periodic table. Connected to this element M are from three to five substituents, wherein from one to three of these substituents are organic groups to be discussed further below, with the remainder being a halogen or an alkoxy group.

Of particular interest are Compound Examples VIII and IX where three organic groups are bound to the metal or metalloid M group, which when hydrolyzed (fully or partially) with other Compound Examples herein (preferably those having one or two organic groups) allow for greater control of the process for making the dielectric material of the invention.

Compound Example I

A compound is provided of the general formula: $R^1MOR^3_3$, where $R^1$ is any partially or fully fluorinated organic group (preferably a partially or fully fluorinated aryl, alkenyl, alkynyl or alkyl group), where M is an element selected from column 14 of the periodic table, and where $OR^3$ is an alkoxy group—except where M is Si, $R^1$ is perfluorinated phenyl or perfluorinated vinyl, and $OR^3$ is ethoxy, which can be part of one of the novel methods for making the materials of the invention as will be discussed further below. $R^1$ can have an inorganic component, though if so, a portion should preferably be a partially or fully fluorinated organic component. In various embodiments, $OR^3$ can have one to 12 carbons, one to 7 carbons, and more preferably one to five carbons, and the like. The carbon chain R can be linear, branched or cyclic. In a more preferred example of this, $R^1$ comprises a double bond that is capable of physical alteration or degradation in the presence of an electron beam, or electromagnetic radiation and a photoinitiator (or sensitizer, photoacid or thermal initiator—to be discussed further below). In this example, $R^1$ could be an alkenyl group such as a vinyl group, or could be an epoxy or acrylate group, that is preferably partially or fully fluorinated. Such a group, as will be discussed further herein, can allow for crosslinking upon application of an electron beam or preferably electromagnetic radiation (e.g., directing ultraviolet light through a mask with the material comprising a photoinitiator). In the alternative, $R^1$ could be an organic group that is (or a hybrid organic-inorganic group that comprises) a single or multi ring structure (an "aryl group") or an alkyl group of any length, such as from 1 to 14 carbon atoms or longer (preferably 4-10)—the alkyl group capable of being a straight or branched chain. If $R^1$ is a ring structure, or a carbon chain of sufficient length (e.g., 4 (or 5) or more carbons), then such an $R^1$ group can provide bulk to the final material once hydrolyzed, condensed and deposited on a substrate. If $R^1$ is a ring structure, whether single ring or multi ring, it can have substituents thereon, fluorinated, though not necessarily, such as alkyl or alkenyl substituents (preferably from 1 to 5 carbons), and where the substituents on the ring structure can be at from 1 to 3 location around the ring. $R^1$ can be a 4 to 8 sided ring structure (preferably 5 or 6 sided) which ring structure could comprise N or O. $R^1$ could comprise nitrogen, or $R^1$ can also have an oxygen component, such as a carboxylate group (e.g., acrylate, butenecarboxylate, propenecarboxylate, etc.).

For purposes of this disclosure The term 'alkenyl' as used herein includes straight-chained and branched alkenyl groups, such as vinyl and allyl groups. The term 'alkynyl' as used herein includes straight-chained and branched alkynyl groups, suitably acetylene. 'Aryl' means a mono-, bi-, or more cyclic aromatic carbocyclic group; examples of aryl are phenyl and naphthyl. More specifically the alkyl, alkenyl or alkynyl may be linear or branched. Alkyl contains preferably 1 to 18, more preferably 1 to 14 and particularly preferred 1 to 12 carbon atoms. The alkyl is preferably branched at the alpha or beta position with one and more, preferably two, C1 to C6 alkyl groups, especially preferred per-fluorinated alkyl, alkenyl or alkynyl groups. Some examples are non-fluorinated, partially fluorinated and per-fluorinated i-propyl, t-butyl, but-2-yl, 2-methylbut-2-yl, and 1,2-dimethylbut-2-yl. Alkenyl contains preferably 2 to 18, more preferably 2 to 14 and particularly preferred 2 to 12 carbon atoms. The ethylenic, i.e., two carbon atoms bonded with double bond, group is preferably located at the position 2 or higher, related to the Si or M atom in the molecule. Branched alkenyl is preferably branched at the alpha or beta position with one and more, preferably two, C1 to C6 alkyl, alkenyl or alkynyl groups, particularly preferred per-fluorinated alkyl, alkenyl or alkynyl groups.

For purposes of this specification, alkynyl can preferably contains preferably 3 to 18, more preferably 3 to 14 and particularly preferred 3 to 12 carbon atoms. The ethylinic group, i.e., two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, particularly preferred per-fluorinated alkyl, alkenyl or alkynyl groups.

Alkoxy, acyl, acyloxy herein have meanings that are understood by the persons skilled in the art, and include straight and branched chains.

In the context of this specification, the organic group substituent halogen may also be F, Cl, Br or I atom and is preferably F or Cl. Generally, term 'halogen' herein means a fluorine, chlorine, bromine or iodine atom.

In the example above, in $R^1MOR^3_3$, M can be a tetravalent element from column 14 of the periodic table (e.g., Si or Ge), or a tetravalent element from column 16—e.g., Se (or a tetravalent early transition metal—such as titanium or zirconium). Also, $OR^3$ is an alkoxy group, though preferably one having from 1 to 4 carbon atoms (longer alkoxy groups can be used, but are more expensive).

Specific examples include:

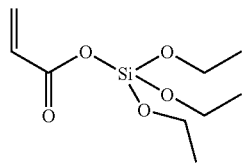

Acryltriethoxysilane

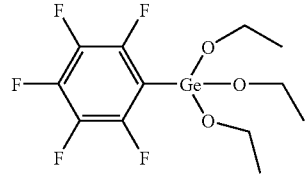

Pentafluorophenyltriethoxygermane

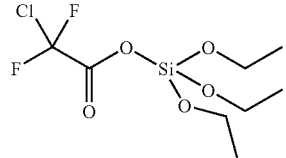

Chlorodifluoroacetic acid, triethoxy silyl ester

-continued

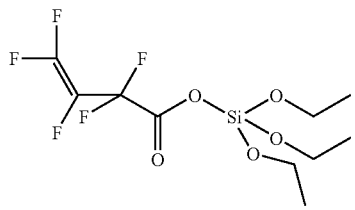

Perfluoro-3-butene acid, triethoxysilyl ester

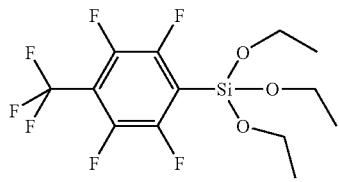

4-triethoxysilyl perfluorostyrene

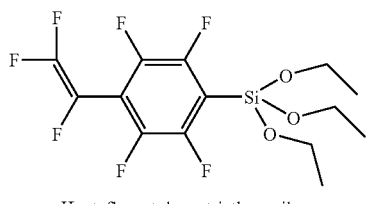

Heptafluorotoluenetriethoxysilane

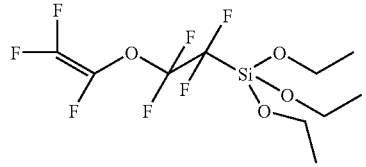

Tetrafluoroethyltrifluorovinyl ether triethoxysilane

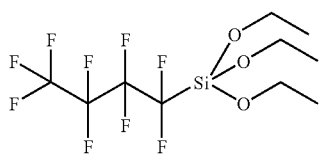

Perfluorobutanetriethoxysilane

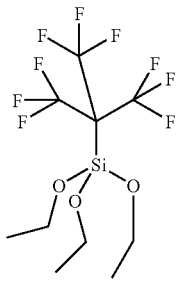

Perfluoro-t-butyl triethoxysilane

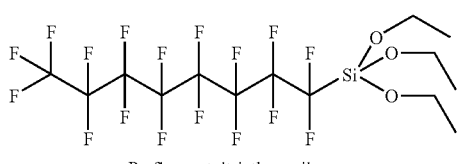

Perfluoroctyltriethoxysilane

-continued

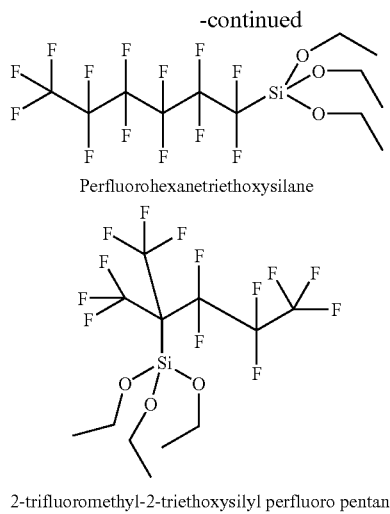

Perfluorohexanetriethoxysilane 2-trifluoromethyl-2-triethoxysilyl perfluoro pentane Precursors for the above compositions are available from, Gelest, Inc., Tullytown, Pa., Sigma-Aldrich, Stockholm, Sweden and ABCR Gmbh & Co., Karlsruhe, Germany. It will be appreciated that precursors for the compositions listed below are also commercially available from these sources.

Compound Example II

In yet another compound example, a compound is provided of the general formula: $R^1MOR^3{}_2X$, where $R^1$ is any partially or fully fluorinated organic group (preferably a partially or fully fluorinated aryl, alkenyl, alkynyl or alkyl group) as set forth above, where M is an element selected from group 14 of the periodic table as mentioned above, where X is a halogen, and where $OR^3$ is an alkoxy group as above. X in this example is preferably F, Cl, Br or I, and more preferably Cl or Br. Specific examples of compounds within this category include

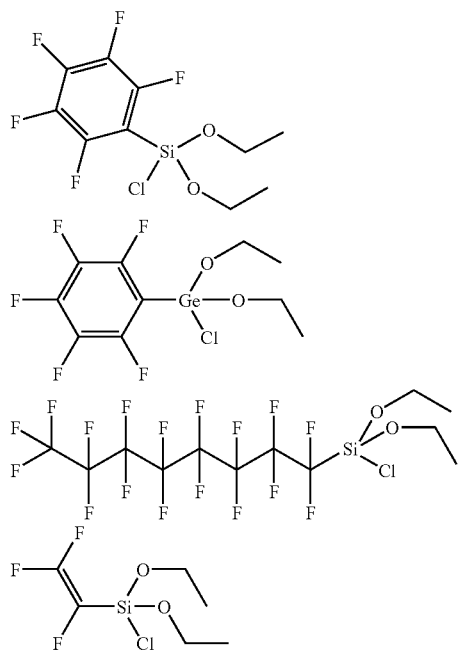

-continued

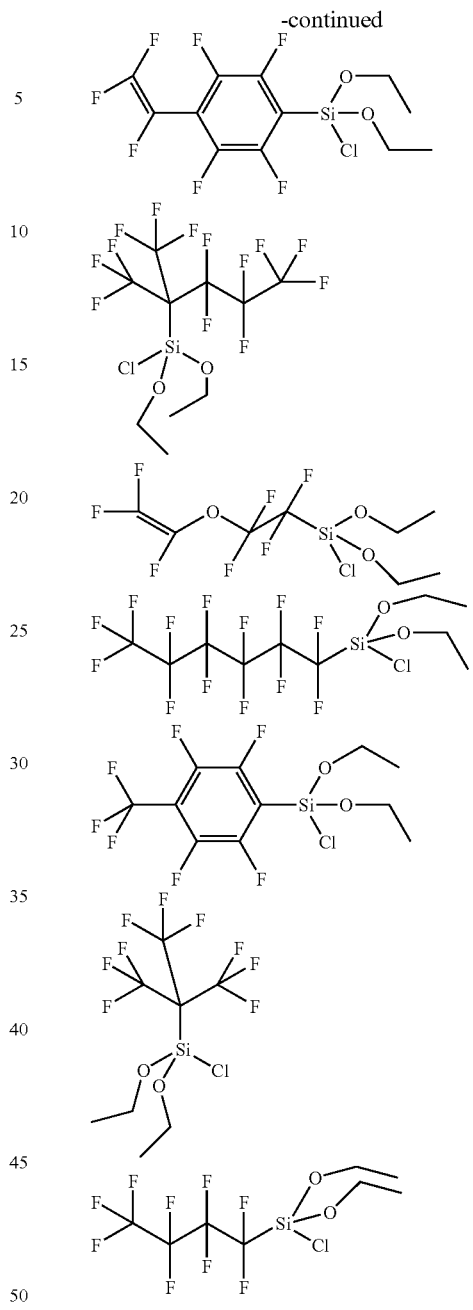

Compound Example III

In another compound example, a compound is provided of the general formula: $R^1MX_2OR^3$, where $R^1$ is any partially or fully fluorinated organic group (preferably a partially or fully fluorinated aryl, alkenyl, alkynyl or alkyl group) as set forth above, where M is an element selected from group 14 of the periodic table as mentioned above, where $OR^3$ is an alkoxy group as above, and where X is a halogen as above—Except where M is Si, $R^1$ is perfluorinated phenyl, X is Cl, and $OR^3$ is ethoxy, which, though not novel per se, is novel when used as part of the methods for making the materials of the invention as will be discussed further below. Specific examples within this category include

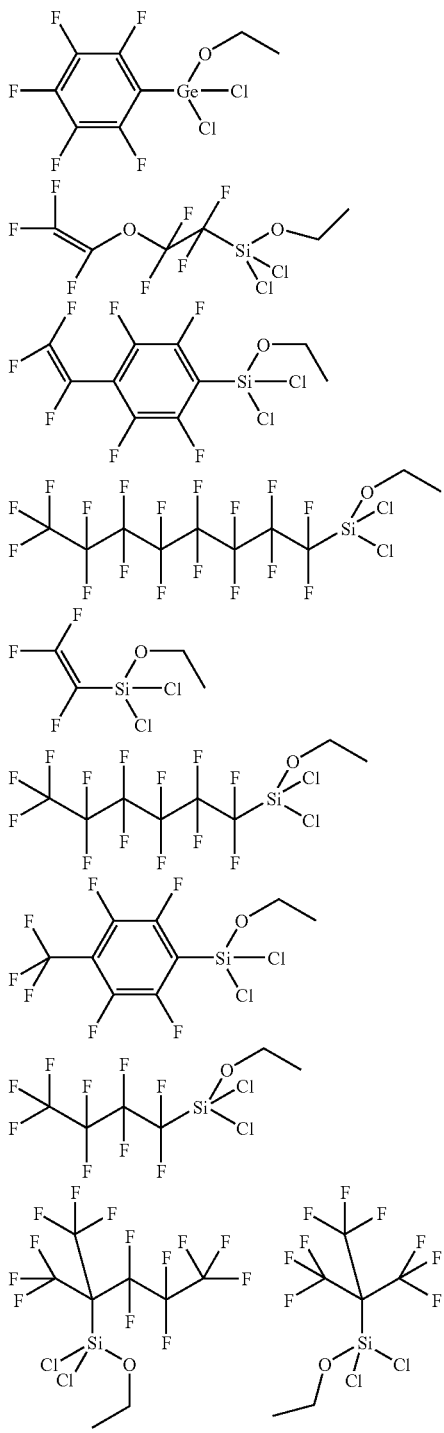

Compound Example IV

In a further compound example, a compound is provided of the general formula: $R^1MX_3$, where $R^1$ is any partially or fully fluorinated organic group (preferably a partially or fully fluorinated aryl, alkenyl, alkynyl or alkyl group) as set forth above, where M is an element selected from group 14 of the periodic table as mentioned above, and where X is a halogen as above—Except where M is Si, $R^1$ is perfluorinated phenyl, perfluorinated methyl or perfluorinated vinyl, and X is Cl, which, though not novel per se, are novel when used as part of the methods for making the materials of the invention as will be discussed further below. (If M is Si and X is Cl, some of these novel trichlorosilanes could be used for forming self assembled monolayers for making a surface hydrophobic, preferably by application in the vapor phase to a surface made of silicon and having OH end groups and moisture.) Specific examples within this category include:

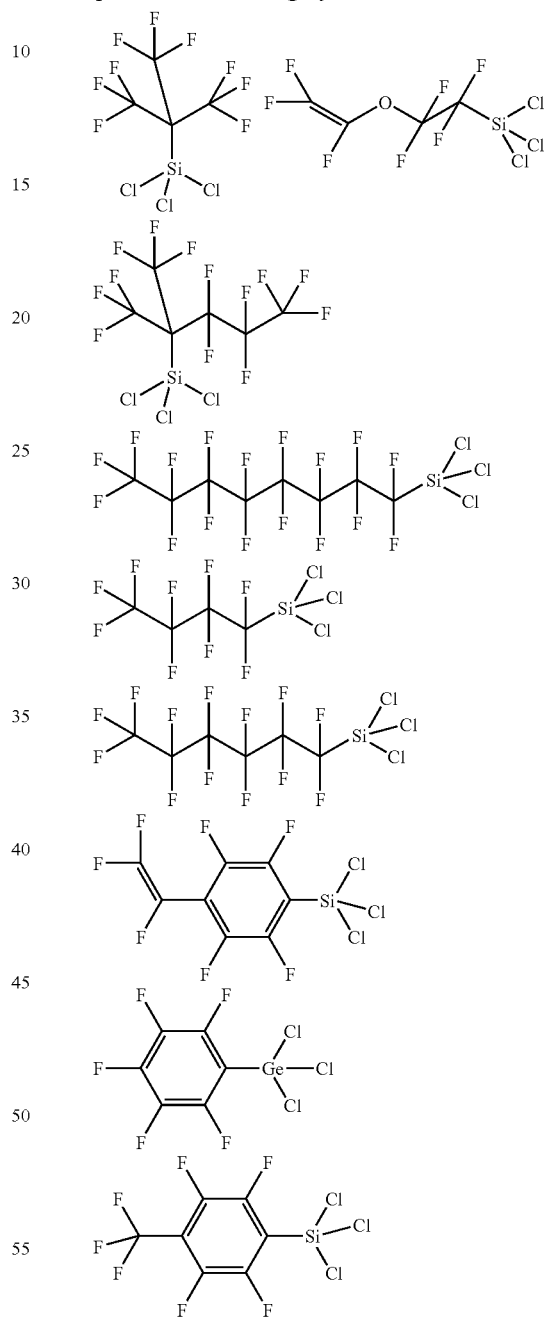

Compound Example V

In yet another compound example, a compound is provided of the general formula: $R^1R^2MOR^3{}_2$, where $R^1$ is any partially or fully fluorinated organic group (preferably a partially or fully fluorinated aryl, alkenyl, alkynyl or alkyl group) as set forth above with respect to $R^1$, $R^2$ is any partially or fully fluorinated organic group (preferably a partially or fully fluorinated aryl, alkenyl, alkynyl or alkyl group) as set forth above with respect to $R^1$, or any such organic groups nonfluorinated, and where $R^1$ and $R^2$ are the same or different from each other, where M is an element selected from group 14 of the periodic table as mentioned above, and where $OR^3$ is an alkoxy group as above—except where M is Si, $OR^3$ is ethoxy and $R^1$ and $R^2$ are perfluorinated phenyl groups, which compound is not novel per se, but is novel when used as part of the methods for making materials of the invention as set forth below. Specific examples within this category include:

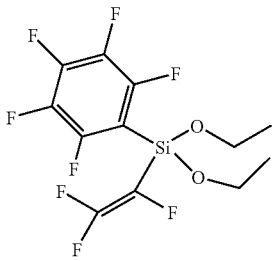

Pentafluorophenyltrifluorovinyldiethoxy-silane

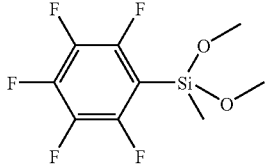

Methylpentafluorophenyldimethoxy-silane

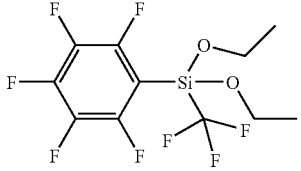

Pentafluorophenyltrifluoromethyl diethoxysilane

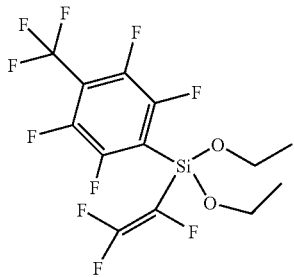

Perfluorotoluenetrifluorovinyldiethoxy-silane

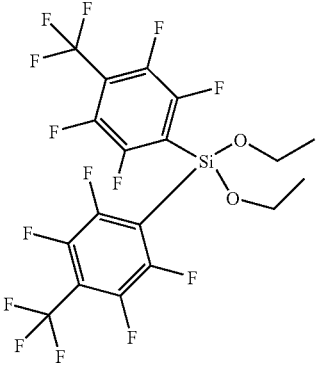

Di(perfluorotoluene)diethoxysilane

-continued

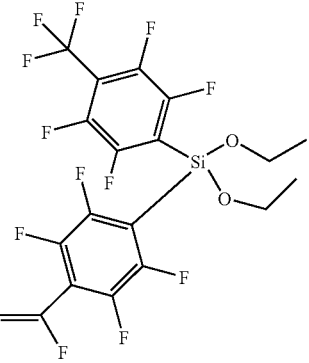

Perfluorostyreneperfluorotoluenediethoxy-silane

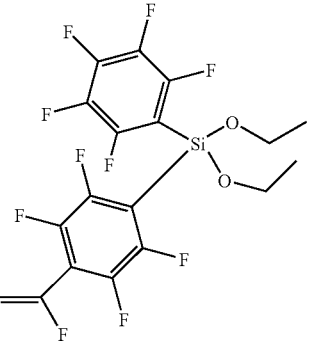

Pentafluorophenylperfluorostyryl-diethoxysilane

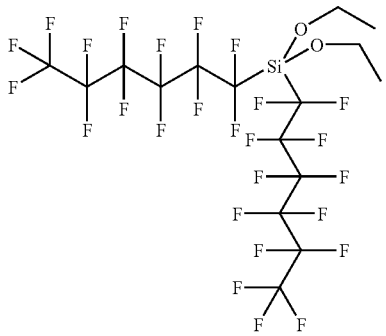

Bis(perfluorohexane)diethoxysilane

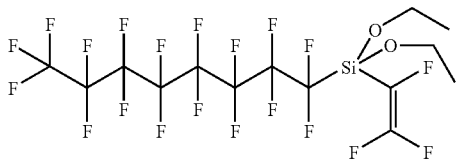

Perfluoroctyltrifluorovinyldiethoxysilane

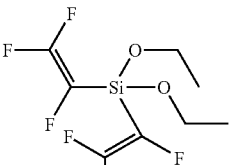

Bis(trifluorvinyl)diethoxysilane

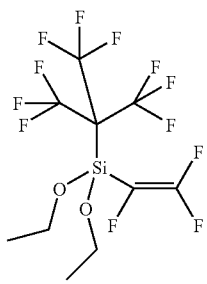

Perfluoro(t-butyl)trifluorovinyldiethoxysilane

Compound Example VI

In another compound example, a compound is provided of the general formula: $R^1R^2MXOR^3$, where $R^1$ is any partially or fully fluorinated organic group (preferably a partially or fully fluorinated aryl, alkenyl, alkynyl or alkyl group) as set forth above with respect to $R^1$, $R^2$ is any partially or fully fluorinated organic group (preferably a partially or fully fluorinated aryl, alkenyl, alkynyl or alkyl group) as set forth above with respect to $R^1$, or any such organic groups nonfluorinated, and where $R^1$ and $R^2$ are the same or different from each other, where M is an element selected from group 14 of the periodic table as mentioned above, where $OR^3$ is an alkoxy group as above, and where X is a halogen. $R^1$ and $R^2$ can be the same or different from each other. Specific examples within this category include:

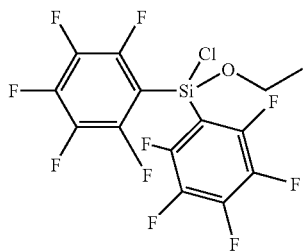

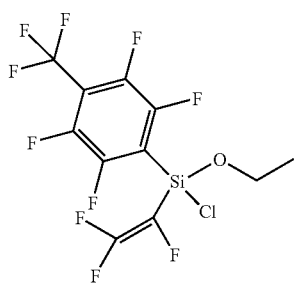

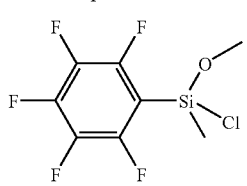

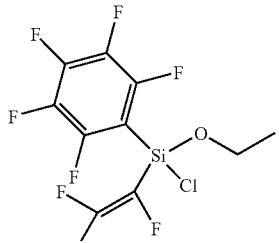

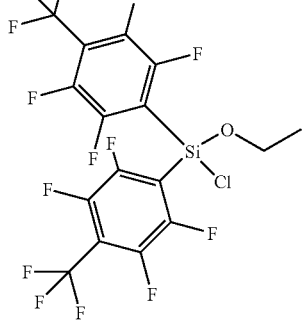

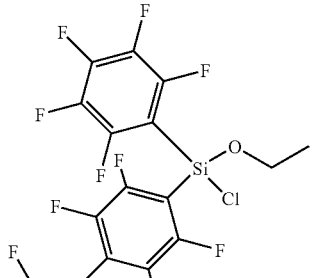

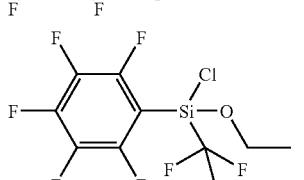 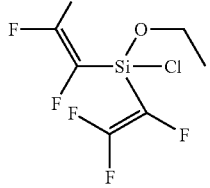

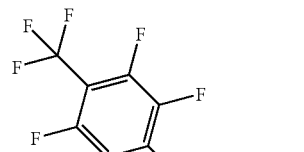

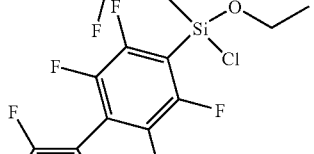

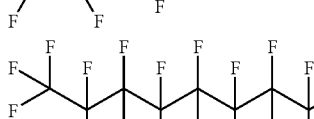

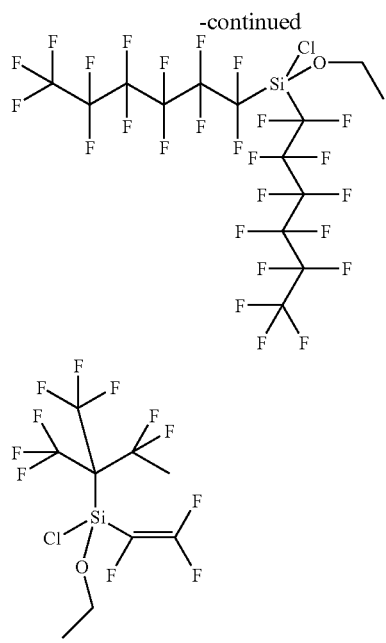

Compound Example VII

In a further compound example, a compound is provided of the general formula: $R^1 R^2 MX_2$, where $R^1$ is any partially or fully fluorinated organic group (preferably a partially or fully fluorinated aryl, alkenyl, alkynyl or alkyl group) as set forth above with respect to $R^1$, $R^2$ is any partially or fully fluorinated organic group (preferably a partially or fully fluorinated aryl, alkenyl, alkynyl or alkyl group) as set forth above with respect to $R^1$, or any such organic groups nonfluorinated, and where $R^1$ and $R^2$ are the same or different from each other, where M is an element selected from group 14 of the periodic table as mentioned above, and where X is a halogen as above—Except where M is Si, $R^1$ and $R^2$ are perfluorinated phenyl, and X is Cl, which, though not novel per se, is novel when used as part of the methods for making the materials of the invention as will be discussed further below. Specific examples within this category include:

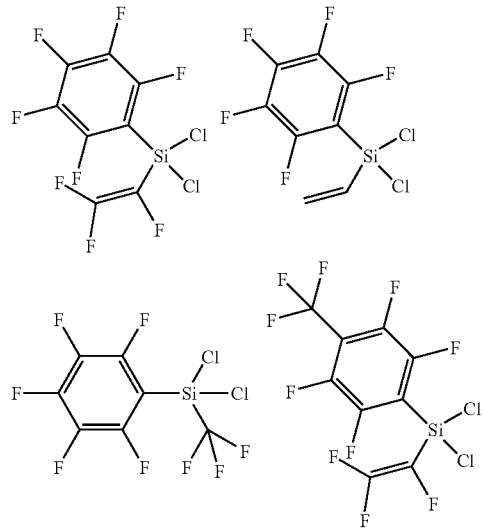

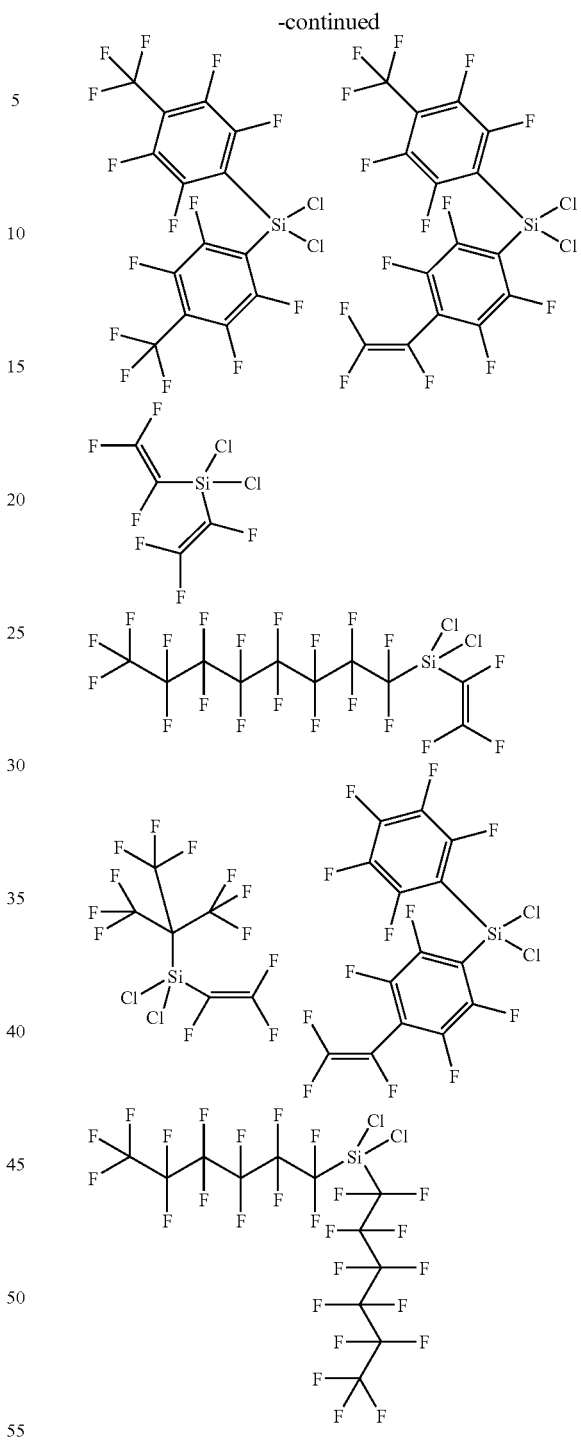

As Compounds V-VII have two organic groups, they can be formed by various combinations of Methods A, B and/or C (described in further detail below).

Compound VIII

In a further compound example, a compound is provided of the general formula: $R^1 R^2 R^3 MOR^3$, where $R^1$, $R^2$ and $R^3$ are independently an aryl, alkenyl, alkynyl or alkyl group) as set forth above with respect to $R^1$ and $R^2$, and where $R^1$, $R^2$ and $R^3$ can each be the same or different from each other (and preferably at least one of where $R^1$, $R^2$ and $R^3$ is partially or fully fluorinated), where M is preferably an element selected from group 14 of the periodic table as above, and where $OR^3$ is an alkoxy group as above. One example is

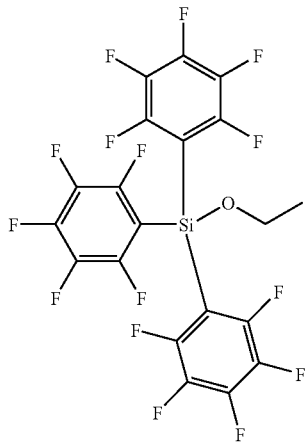

though the organic groups need not each be the same as in this example, and need not each be fluorinated (though preferably at least one of the organic groups is fluorinated).

Compound IX

In another compound example, a compound is provided of the general formula: $R^1R^2 R^3MX$, where $R^1$, $R^2$ and $R^3$ are independently an aryl, alkenyl, alkynyl or alkyl group) as set forth above with respect to $R^1$ and $R^2$, and where $R^1$, $R^2$ and $R^3$ can each be the same or different from each other (and preferably at least one of where $R^1$, $R^2$ and $R^3$ is partially or fully fluorinated), where M is preferably an element selected from group 14 of the periodic table as above, and where X is a halogen as above. One example is:

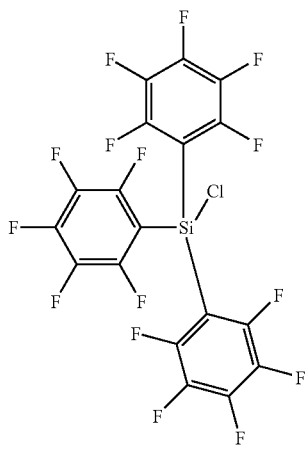

As Compounds VIII and IX have three organic groups, they can be formed by various combinations of Methods A, B and/or C (which methods are described in further detail below).

Other Compounds

Additional compounds for making the materials of the invention include those having the general formula $R^1MHX_2$ where $R^1$, M and X are as above and H is hydrogen. One example is:

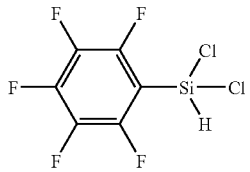

Other examples, where the fluorinated phenyl group is replaced with a substituted phenyl, fluorinated alkyl, vinyl, etc. are possible.

It should be noted that M in the compound formula examples above need not be tetravalent. M can also have other valencies, though preferably tri- or penta-valent. Examples would include early transition metals in group 3 or 5 of the periodic table (e.g., Y, V or Ta), or elements in columns 13 (column headed by B) or 15 (column headed by N), such as B, Al or As. In such situations, the compounds above would have one fewer or one additional alkoxy ($OR^3$), halogen (X) or an organic group ($R^1$ or $R^2$ independently from the other organic group(s)). Examples include $R^1MOR^3X$, $R^1MOR^3_2$, $R^1MX_2$, $R^1R^2MX$, $R^1R^2MOR^3$, where M is a trivalent early transition metal (or similar examples with five substituents selected from $R^1$ and/or $R^2$ groups, as well as alkoxy and halogens for pentavalent elements (including metalloids or transition metals). Such compounds could have the formula $R^1{}_{3-m}MOR^3{}_m$, $R^1{}_{5-m}MOR^3{}_m$, $R^2R^1{}_{4-m}MOR^3{}_m$ or $R^2R^1{}_{4-m}MOR^3{}_m$. If such tri- or penta-valent elements are used, such a compound would preferably be hydrolyzed and condensed as a dopant, rather than as the main portion of the material at the time of hydrolysis and condensation (likewise with non-silicon tetravalent elements that form compounds in accordance with the tetravalent examples above, such as germanium compounds).

It should also be noted that the structures illustrated above are exemplary only, as other ring structures (3 sided—e.g., epoxy, or 4 to 8 sided—preferably 5 or 6 sided) are possible, which structures can include nitrogen or oxygen in or bound the ring. The aryl group can have from 1 to 3 substituents, such as one or more methyl, ethyl, ally, vinyl or other substituents—that can be fluorinated or not. Also, carbon chain R groups can include oxygen (e.g., carboxylate) or nitrogen or sulfur. If an alkyl group is bound to the silicon (or other M group), it can have from 1 to 4 carbons (e.g., a C2+ straight or C3+ branched chain), or up to 14 carbons (or more)—if used as a bulk enhancing group for later hydrolysis and deposition, 4 or more carbons are preferable. These aryl groups can be fully or partially fluorinated, as can alkenyl or alkynyl groups if used.

Methods of Making the Compounds for Later Hydrolysis and Condensation

In a number of the following examples of methods for making the materials of the invention, "M" is silicon, $OR^3$ is ethoxy, and X is Cl. However, as noted above, other alkoxy groups could easily be used (methoxy, propoxy, etc.), and other group 3-5 or 13-16 elements could be used in place of silicon and other halogens in place of chlorine. Starting materials can vary from tetraethoxy silane, to ethoxy silanes having one or more organic groups bound to the silicon, to chorosilanes having one or more chlorine groups and/or one or more organic groups, as well as starting materials having chlorine and alkoxy groups and with one or more organic groups. Any compound examples within Compounds I-IX above could be used as starting materials—or could be intermediate or final compounds as will be seen below. For example, trifluorovinyltriethoxysilane could be a final compound resulting from reacting a particular trifluorovinyl compound with tetraethoxysilane, or trifluorovinylsilane could be a starting material that, when reacted with a particular pentafluorophenyl compound, results in pentafluorophenyltrifluorovinyldiethoxysilane. As mentioned above, it is also preferred that any organic groups that are part of the starting material or are "added" by chemical reaction to become part of the compound as set forth below, are partially or fully fluorinated (or fully or partially deuterated), though such is not necessary as will also be seen below.

One example of a method for making the materials of the present invention comprises providing a compound $R^1_{4-q}MOR^3_q$ where M is selected from group 14 of the periodic table, $OR^3$ is an alkoxy group, $R^1$ is an alkyl, alkenyl, aryl or alkynyl, and q is from 2 to 4; reacting the compound $R^1_{4-q}MOR^3_q$ with either a) Mg and $R^2X^2$ where $X^2$ is Cl, Br or I and $R^2$ is an alkyl, alkenyl, aryl or alkynyl group, or b) reacting with $R^2X^1$ where $R^2$ is an alkyl, alkenyl, aryl or alkynyl group and wherein $R^2$ is fully or partially fluorinated or deuterated and $X^1$ is an element from group 1 of the periodic table; so as to replace one of the $OR^3$ groups in $R^1_{4-q}MOR^3_q$ so as to form $R^1_{4-q}R^2MOR^3_{q-1}$.

The starting material preferably has 1 or 2 (or no) organic groups ($R^1$) bound to the group 14 element "M", which organic groups may or may not comprise fluorine, with the remaining groups bound to M being alkoxy groups. An additional preferably fluorinated (partially of fully) organic group becomes bound to the group 14 element by one of a number of reactions. One method (Method A) involves reacting the starting material with magnesium and a compound having the desired organic group ($R^2$) bound to a halogen $X^2$ (preferably Cl, Br or I)—namely $R^2 X^2$, which reaction replaces one of the alkoxy groups with the organic group $R^2$. In the above example, a single alkoxy group is replaced, however, depending upon the molar ratios of starting material to $R^2X^2$ and Mg, more than one alkoxy group can be replaced with an $R^2$ organic group. In one example of the above, a tetraethoxysilane, $MOR^3_4$ is reacted with a compound $R^2X^2$ where $R^2$ is a preferably fluorinated alkyl, aryl, alkenyl or alkynyl group and $X^2$ is preferably Br or I, so as to form $R^2MOR^3_3$. In another example, $R^1MOR^3_3$ is reacted with $R^2X^2$ so as to form $R^1R^2MOR^3_2$. This group of reactions can be referred to as: reacting the starting material $R^1_{4-q} MOR^3_q$ with $R^2X^2$ where $R^2$ is a preferably fluorinated alkyl, aryl, alkenyl or alkynyl group and $X^2$ is preferably Br or I, so as to form $R^1_{4-q}R^2MOR^3_{q-1}$.

This method A can be described as a method comprising reacting a compound of the general formula $R^1_{4-m}MOR^3_m$, wherein m is an integer from 2 to 4, $OR^3$ is an alkoxy, and M is an element selected from group 14 of the periodic table; with a compound of the general formula $R^2X^2$+Mg, wherein $X^2$ is Br or I, where $R^1$ and $R^2$ are independently selected from alkyl, alkenyl, aryl or alkynyl, and wherein at least one of $R^1$ and $R^2$ is partially or fully fluorinated, so as to make a compound of the general formula $R^2MR^1_{3-n}OR^3_n$, wherein n is an integer from 1 to 3.

An alternate to the above method (Method B) is to react the same starting materials ($R^1_{4-q} MOR^3_q$) with a compound $R^2X^1$ where, as above, $R^2$ is an alkyl, alkenyl, aryl or alkynyl group and wherein $R^2$ is fully or partially fluorinated or deuterated and $X^1$ is an element from group 1 of the periodic table; so as to replace an $OR^3$ group in $R^1_{4-q} MOR^3_q$ to form $R^1_{4-q} R^2MOR^3_{q-1}$. In this example, $X^1$ is an element from group 1 of the periodic table, and is preferably Na, Li or K (more preferably Na or Li). In one example of the above, a tetraethoxysilane, $MOR^3_4$ is reacted with a compound $R^2X^1$ where $R^2$ is a preferably fluorinated alkyl, aryl, alkenyl or alkynyl group and $X^1$ is preferably an element from group I of the periodic table, so as to form $R^2MOR^3_3$. In another example, $R^1MOR^3_3$ is reacted with $R^2X^1$ so as to form $R^1R^2MOR^3_2$.

This method B can be described as a method comprising reacting a compound of the general formula $R^1_{4-m}MOR^3_m$ wherein m is an integer from 2 to 4, $R^1$ is selected from alkyl, alkenyl, aryl, or alkyl, alkenyl or aryl, and wherein $R^1$ is nonfluorinated, or fully or partially fluorinated, $OR^3$ is alkoxy, and M is an element selected from group 14 of the periodic table; with a compound of the general formula $R^2M1$, wherein $R^2$ is selected from alkyl, alkenyl, aryl, alkynyl, and wherein $R^2$ is at least partially fluorinated; and M1 is an element from group I of the periodic table; so as to make a compound of the general formula $R^1_{4-m}MOR^3_{m-1}R^2$.

A modification (Method C) of the aforementioned (Method B), is to react the starting material ($R^1_{4-q} MOR^3_q$), with a halogen or halogen compound so as to replace one or more of the $OR^3$ groups with a halogen due to reaction with the halogen or halogen compound. The halogen or halogen compound can be any suitable material such as hydrobromic add, thionylbromide, hydrochloric acid, chlorine, bromine, thionylchloride or sulfurylchloride and the like. Depending upon the ratio of halogen or halogen compound to starting material (and other parameters such as reaction time and/or temperature), one or more alkoxy groups can be replaced by a halogen—though in most examples, a single alkoxy group or all alkoxy groups will be replaced. If a single alkoxy group is replaced, then the starting material $R^1_{4-q} MOR^3_q$ becomes $R^1_{4-q} MOR^3_{q-1}X^3$ where $X^3$ is a halogen from the halogen or halogen compound reacted with the starting material (or simply begin with starting material $R^1_{4-q} MOR^3_{q-1}X^3$). If all alkoxy groups are replaced due to the reaction with the halogen or halogen compound, then the starting material $R^1_{4-q} MOR^3_q$ becomes $R^1_{4-q} MX^3_q$. Then, as mentioned for Method B above, either starting material $R^1_{4-q} MOR^3_{q-1}X^3$ or $R^1_{4-q} MX^3_q$ is reacted with a compound $R^2X^1$ where $R^2$ is a preferably fluorinated alkyl, aryl, alkenyl or alkynyl group and $X^1$ is preferably an element from group I of the periodic table, so as to form $R^1_{4-q} R^2MOR^3_{q-1}$, $R^1_{4-q}R^2MX^3_{q-1}$ (or even $R^1_{4-q}R^2_2MX^3_{q-2}$ depending upon reaction conditions). A reaction with $R^1_{4-q} MOR^3_{q-1}X^3$ is preferred due to greater ease of control of the reaction.

This Method C can be described as a method comprising reacting a compound of the general formula $X^3MOR^3_3$, where $X^3$ is a halogen, M is an element selected from group 14 of the periodic table, and $OR^3$ is alkoxy; with a compound of the general formula $R^1M1$; where $R^1$ is selected from alkyl, alkenyl, aryl and alkynyl and wherein $R^1$ is partially or fully fluorinated; and M1 is an element from group I of the periodic table; so as to form a compound of the general formula $R^1MOR3_3$.

Related Methods B and C can be described as a single method comprising reacting a compound of the general formula $R^1_{4-m}MOR^3_{m-n}X_n$ wherein m is an integer from 2 to 4, and n is an integer from 0 to 2, $R^1$ is selected from alkyl, alkenyl, aryl, or alkyl, alkenyl or aryl, and wherein $R^1$ is nonfluorinated, or fully or partially fluorinated; $OR^3$ is alkoxy, and M is an element selected from group 14 of the periodic table; with a compound of the general formula $R^2M1$, wherein $R^2$ is selected from alkyl, alkenyl, aryl, alkynyl, and wherein $R^2$ is at least partially fluorinated, and M1 is an element from group I of the periodic table; so as to make a compound of the general formula $R^2MR^1_{4-m}OR^3_{m-n}X_{n-1}$.

Of course, as will be seen below, the above starting materials in the method examples set forth above are only examples, as many other starting materials could be used. For example, the starting material could be a halide rather than an alkoxide (e.g., a mono-, di- or trichlorosilanes) or another material having both alkoxy and halogens on the group 14 element, along with 0, 1 or even 2 organic groups (alkyl, alkenyl, aryl, alkynyl) also bound to the group 14 element. Though the methods for making the materials of the invention preferably use starting materials having the group 14 element set forth above, many different combinations of alkoxy groups, halogens, and organic groups (alkyl, alkenyl, etc.) can be bound to the group 14 element. And, of course, such starting materials can be commercially available starting materials or can be made from other available starting materials (in which case such materials are intermediate compounds in the methods for making the materials of the invention).

In addition, the methods for making the materials of the invention include, a method for forming a final compound could include Methods A, B and/or C above. For example, one organic group, preferably fluorinated, could become bound to the group 14 element M by Method A followed by binding a second organic group, preferably fluorinated, to the group 14 element M by Method B. Or, Method B could be performed first, followed by Method A—or Method C could be performed in combination with Methods A and/or B, etc. And, of course, any particular reaction (binding of an organic group to M) could be performed only once by a particular reaction, or multiple times (binding of multiple organic groups, the same or different from each other) by repeating the same reaction (a, b or c) multiple times. Many combinations of these various reactions and starting materials are possible. Furthermore, any of the methods or method combinations could include any of a number of additional steps including preparation of the starting material, replacing one or more alkoxy groups of the final compound with halogens, purifying the final compound, hydrolysis and condensation of the final compound (as will be described further below), etc.

EXAMPLE 1

Making a Compound I Via Method B

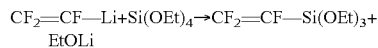

200 ml of freshly distilled dry $Et_2O$ is added to a 500 ml vessel (under an argon atmosphere). The vessel is cooled down to −80° C. and 15 g (0.129 mol) of $CF_2$=CFCl gas is bubbled to $Et_2O$. 100 ml (0.13 mol) of sec-BuLi is added dropwise during three hours. The temperature of the solution is kept below −60° C. all the time. The solution is stirred for 15 minutes and 29 ml (27.08 g, 0.130 mol) of $Si(OEt)_4$ is added in small portions. The solution is stirred for over night allowing it to warm up to room temperature. Formed red solution is filtered and evaporated to dryness to result crude trifluorovinyltriethoxysilane, $CF_2$=CFSi(OEt)$_3$.

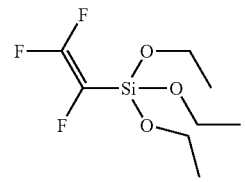

EXAMPLE 2

Making a Compound I Via Method C

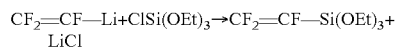

$CF_2$=CFSi(OEt)$_3$ is also formed when 30.80 g (0.155 mol) ClSi(OEt)$_3$ in $Et_2O$ is slowly added to solution of $CF_2$=CF—Li (0.155 mol, 13.633 g, prepared in situ) in $Et_2O$ at −78° C. Reaction mixture is stirred overnight allowing it slowly warm to room temperature. LiCl is removed by filtration and solution evaporated to dryness to result yellow liquid, crude trifluorovinyltriethoxysilane.

EXAMPLE 3

Making a Compound IV Via Method B or C

Follow steps in Example 1 or 2 above, followed by

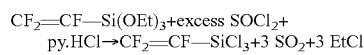

24.4 g (0.100 mol) crude trifluorovinyltriethoxysilane, 44 mL (0.60 mol, 71.4 g) thionylchloride and 1.1 g (0.0045 mol) pyridinium hydrochloride are refluxed and stirred for 24 h. Excess of $SOCl_2$ is evaporated and trifluorovinyltrichlorosilane

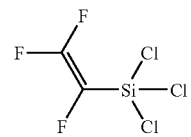

is purified by distillation.

EXAMPLE 4

Making a Compound I Via Method A

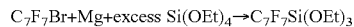

250 g (0.8418 mol) heptafluorobromotoluene, 22.69 g (0.933 mol) magnesium powder, small amount of iodine (15 crystals) and 750 mL (3.3672 mol, 701.49 g) tetraethoxysilane are mixed together at room temperature and diethylether is added dropwise to the vigorously stirred solution until an exothermic reaction is observed (~250 mL). After stirring at room temperature for 16 h diethylether is evaporated. An excess of n-heptane (~600 mL) is added to precipitate the magnesium salts. Solution is filtrated and evaporated to dryness. The residue is fractionally distilled under reduced pressure to yield heptafluorotoluene-triethoxysilane.

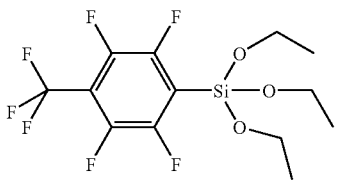

EXAMPLE 5

Making a Compound IV Via Method A

Follow the steps in Example 4, followed by $C_7F_7Si(OEt)_3 + 6\ SOCl_2 + py.HCl \rightarrow C_7F_7SiCl_3$  2.

Where 114.1 g (0.300 mol) heptafluorotoluenetriethoxysilane, 131 mL (1.800 mol, 214.1 g) thionylchloride and 4.51 g (0.039 mol) pyridinium hydrochloride are refluxed and stirred for 16 h. Excess of SOCl$_2$ is evaporated and perfluorotoluenetrichlorosilane

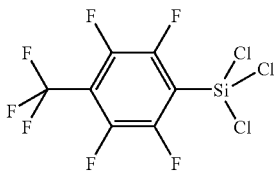

isolated by vacuum-distillation.

EXAMPLE 6

Making a Compound III Via Method A

Follow same steps as in Example 5, except isolate (by vacuum distillation at the end), perfluorotoluenedichloroethoxysilane, CF$_3$—C$_6$F$_4$—Si(OEt)Cl$_2$

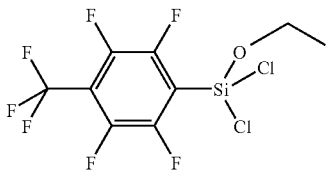

EXAMPLE 7

Making a Compound V from a Compound I or II Via Method C $C_6F_5Si(OEt)_3 + SOCl_2 + py.HCl \rightarrow C_6F_5Si(OEt)_2Cl + EtCl$  1.

$C_6F_5Si(OEt)_2Cl + CF_2\!\!=\!\!CFLi \rightarrow C_6F_5(CF_2\!\!=\!\!CF)Si(OEt)_2$  2.

$C_6F_5(CF_2\!\!=\!\!CF)Si(OEt)_2 + \text{excess } SOCl_2 + py.HCl \rightarrow C_6F_5(CF_2\!\!=\!\!CF)SiCl_2$  3.

152.0 g (0.460 mol) pentafluorophenyltriethoxysilane, 34 mL (0.460 mol, 54.724 g) thionylchloride and 6.910 g (0.0598 mol) pyridinium hydrochloride are refluxed and stirred for 18 h. Pyridinium hydrochloride is precipitated at −78° C. and the solution is filtrated. Pentafluorophenylchlorodiethoxysilane

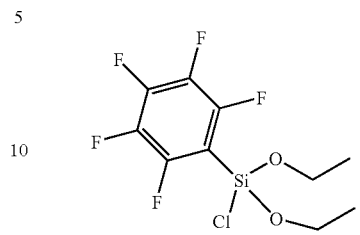

is isolated by vacuum distillation.

Then 49.712 g (0.155 mol) pentafluorophenylchlorodiethoxysilane, C$_6$F$_5$SiCl(OEt)$_2$, in Et$_2$O is slowly added to solution of CF$_2$=CF—Li (0.155 mol, 13.633 g, prepared in situ) in Et$_2$O at −78° C. Reaction mixture is stirred overnight while it will slowly warm to room temperature. LiCl is removed by filtration and the product, pentafluorophenyltrifluorovinyldiethoxysilane,

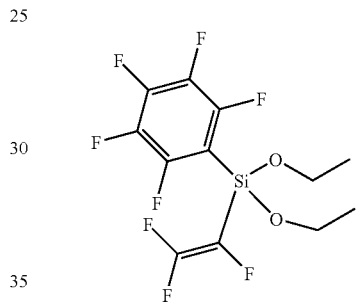

purified by distillation.

EXAMPLE 8

Making a Compound VII from a Compound I or II Via Method C

Follow the steps above for Example 7, and then 12.1 g (0.0328 mol) pentafluorophenyltrifluorovinyldiethoxysilane, 12 mL (0.1638 mol, 19.487 g) thionylchloride and 0.50 g (0.0043 mol) pyridinium hydrochloride are refluxed and stirred for 24 h. Excess of SOCl$_2$ is evaporated and residue is fractionally distilled under reduced pressure to yield a mixture of 80% pentafluorophenyltrifluorovinyldichlorosilane.

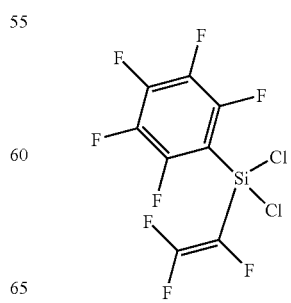

EXAMPLE 9

Making a Compound I Via Method A

61.5 mL (0.4944 mol, 122.095 g) pentafluorobromobenzene, 13.22 g (0.5438 mol) magnesium powder and 250.00 g (0.9888 mol) tetraethoxygermane are mixed together at room temperature and diethylether is added dropwise to the vigorously stirred solution until an exothermic reaction is observed (~400 mL). After stirring at 35° C. for 16 h the mixture is cooled to room temperature and diethylether evaporated. An excess of n-heptane (~400 mL) is added to precipitate the magnesium salts. Solution is filtrated and evaporated to dryness. The residue is fractionally distilled under reduced pressure to yield pentafluorophenyl-triethoxygermane.

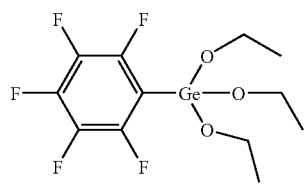

EXAMPLE 10

Making a Compound IV Via Method A

Follow the steps in Example 9, then:

50 g (0.133 mol) pentafluorophenyltriethoxygermane, 58 mL (0.80 mol, 95.2 g) thionylchloride and 1.97 g (0.017 mol) pyridinium hydrochloride are refluxed and stirred for 24 h. Excess of $SOCl_2$ is evaporated and pentafluorophenyltrichlorogermane isolated by vacuum distillation.

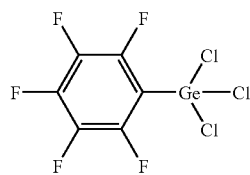

EXAMPLE 11

Making a Compound I Via Method A

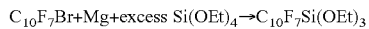

166.5 g (0.50 mol) 2-bromoperfluoronaphthalene, 13.37 g (0.55 mol) magnesium powder and 448.0 mL (2.00 mol, 416.659 g) tetraethoxysilane are mixed together at room temperature and diethylether is added dropwise to the vigorously stirred solution until an exothermic reaction is observed (~200 mL). After stirring at 35° C. for 16 h the mixture is cooled to room temperature and diethylether evaporated. An excess of n-heptane (~400 mL) is added to precipitate the magnesium salts. Solution is filtrated and evaporated to dryness. The residue is fractionally distilled under reduced pressure to yield perfluoronaphthalenetriethoxysilane.

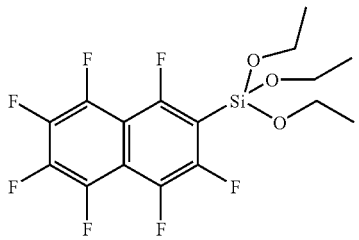

EXAMPLE 12

Making a Compound IV Via Method A

Follow the steps in Example 11, then 100 g (0.240 mol) perfluoronaphthalenetriethoxysilane, 105.2 mL (1.442 mol, 171.55 g) thionylchloride and 3.54 g (0.0306 mol) pyridinium hydrochloride are refluxed and stirred for 24 h. Excess of $SOCl_2$ is evaporated and perfluoronaphthalenetrichlorosilane isolated by vacuum distillation.

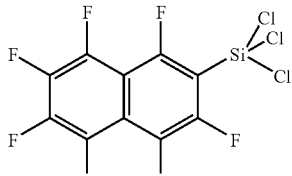

EXAMPLE 13

Making Compound V Via Method A

57.9 mL (0.465 mol, 114.726 g) bromopentafluorobenzene, 12.42 g (0.511 mol) magnesium powder and 265 mL (1.858 mol, 253.128 g) methyltrimethoxysilane are mixed together at room temperature and diethylether is added dropwise to the vigorously stirred solution until an exothermic reaction is observed (~320 mL). After stirring at 45° C. for 16 h the mixture is cooled to room temperature and diethylether evaporated. An excess of n-heptane (~300 mL) is added to precipitate the magnesium salts. Solution is filtrated and evaporated to dryness. The residue, methyl(pentafluorophenyl)-dimethoxysilane, is used without further purification.

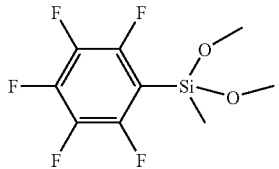

EXAMPLE 14

Making Compound VII Via Method A

Follow steps in Example 13, then 81.68 g (0.300 mol) methyl(pentafluorophenyl)dimethoxysilane, 109 mL (1.50 mol, 178.4 g) thionylchloride and 3.69 g (0.0319 mol) pyridinium hydrochloride are refluxed and stirred for 16 h. Excess of $SOCl_2$ is evaporated and methyl(pentafluorophenyl)dichlorosilane isolated by vacuum-distillation.

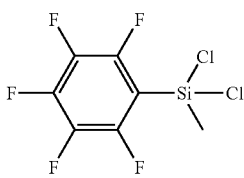

EXAMPLE 15

Making a Compound V Via Method A

265.2 mL (1.95 mol, 525.353 g) bromopentafluorobenzene, 52.11 g (2.144 mol) magnesium powder and 216 mL (0.975 mol, 203.025 g) tetraethoxysilane are mixed together at room temperature and diethylether is added dropwise to the vigorously stirred solution until an exothermic reaction is observed (~240 mL). The solution is stirred for 30 minutes after which additional 90 mL of $Et_2O$ is carefully added. After stirring at 35° C. for 16 h the mixture is cooled to room temperature and diethylether evaporated. An excess of n-heptane (~600 mL) is added to precipitate the magnesium salts. Solution is filtrated and evaporated to dryness. The residue is fractionally distilled under reduced pressure to yield di(pentafluorophenyl)diethoxysilane.

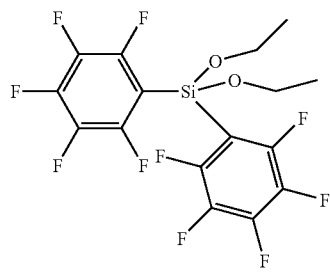

EXAMPLE 16

Making a Compound V Via Method C

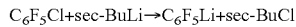

$C_6F_5Li+C_6F_5Si(OEt)_2Cl \rightarrow (C_6F_5)_2Si(OEt)_2+LiCl$ 39.52 g (0.195 mol) chloropentafluorobenzene is weighed to a 1000 mL vessel and 250 mL $Et_2O$ is added. The vessel is cooled down to −70° C. and 150 mL (0.195 mol) of sec-BuLi (1.3 M) is added dropwise during one hour. The temperature of the solution is kept below −50° C. all the time. The solution is stirred for 30 minutes and 62.54 g (0.195 mol) of diethoxychloropentafluorophenylsilane in $Et_2O$ (100 mL) is added in small portions. The solution is stirred for over night allowing it to warm up to room temperature. Formed clear solution is filtered and evaporated to dryness to result di(pentafluorophenyl)diethoxysilane, $(C_6F_5)_2Si(OEt)_2$.

EXAMPLE 17

Making a Compound VII Via Method A or C

Follow the steps in Example 15 or Example 16, then:

$(C_6F_5)_2Si(OEt)_2+SOCl_2+py.HCl \rightarrow (C_6F_5)_2SiCl_2$ 180.93 g (0.400 mol) di(pentafluorophenyl)diethoxysilane, 146 mL (2.00 mol, 237.9 g) thionylchloride and 4.92 g (0.0426 mol) pyridinium hydrochloride are refluxed and stirred for 16 h. Excess of $SOCl_2$ is evaporated and di(pentafluorophenyl)dichlorosilane isolated by vacuum-distillation.

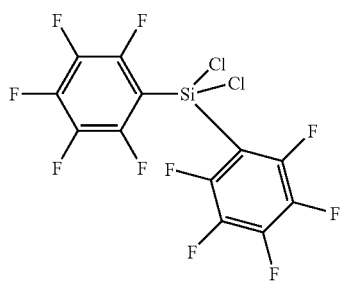

EXAMPLE 18

Making an "Other Compound" Via Method A

600.0 mL (0.300 mol) pentafluorophenyl magnesiumbromide (0.5 M sol. in $Et_2O$) is added dropwise to a solution of 30.3 mL (0.300 mol, 40.635 g) $HSiCl_3$ in $Et_2O$ at −70° C. Reaction mixture is allowed to warm slowly to room temperature by stirring overnight. Diethylether is evaporated and an excess of n-heptane (~200 mL) is added to precipitate the magnesium salts. Solution is filtrated and evaporated to dryness. The residue, pentafluorophenyldichlorosilane, is purified by fractional distillation.

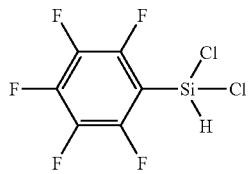

EXAMPLE 19

Making a Compound I Via Method C

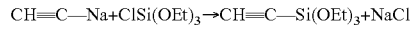

79.49 g (0.400 mol) $ClSi(OEt)_3$ in $Et_2O$ is slowly added to a slurry of $CH\equiv C-Na$ (0.400 mol, 19.208 g) in Xylene/light mineral oil at −78° C. Reaction mixture is stirred overnight allowing it slowly warm to room temperature. NaCl is removed by filtration and solution evaporated to dryness to result acetylenetriethoxysilane.

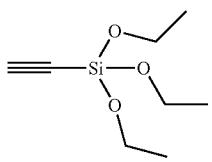

EXAMPLE 20

Making a Compound VII Via Method A

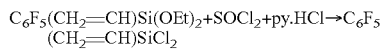

100 mL (0.8021 mol, 198.088 g) pentafluorobromobenzene, 24.90 g (1.024 mol) magnesium powder and 670 mL (3.2084 mol, 610.623 g) vinyltriethoxysilane are mixed together at room temperature and $Et_2O$ is added dropwise to the vigorously stirred solution until an exothermic reaction is observed (~400 mL). After stirring at 35° C. for 16 h the mixture is cooled to room temperature and diethylether evaporated. An excess of n-heptane (~500 mL) is added to precipitate the magnesium salts. Solution is filtrated and evaporated to dryness. The residue is fractionally distilled under reduced pressure to yield pentafluorophenylvinyldiethoxysilane.

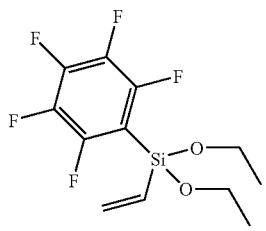

120.275 g (0.3914 mol) pentafluorophenylvinyldiethoxysilane, 143 mL (1.9571 mol, 232.833 g) thionylchloride and 5.880 g (0.0509 mol) pyridinium hydrochloride are refluxed and stirred for 24 h. Excess of $SOCl_2$ is evaporated and pentafluorophenylvinyldichlorosilane

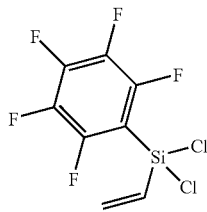

isolated by vacuum distillation.

EXAMPLE 21

Making a Compound I from Method B

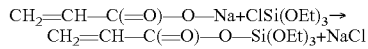

6.123 g (0.0651 mol) sodium acrylate is dissolved to 25 mL THF and cooled to −70° C. 12.8 mL (0.0651 mol, 12.938 g) chlorotriethoxysilane in THF (15 mL) is added dropwise to reaction solution. The solution is stirred for over night allowing it to warm up to room temperature. NaCl is removed by filtration and solution evaporated to dryness to result clear liquid, acryltriethoxysilane.

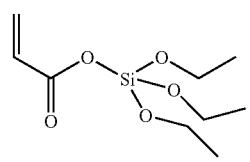

EXAMPLE 22

Making a Compound II

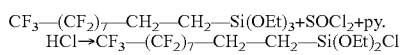

183.11 g (0.300 mol) 1H,1H,2H,2H-Perfluorodecyltriethoxysilane, 22 mL (0.300 mol, 35.69 g) thionylchloride and 4.51 g (0.039 mol) pyridinium hydrochloride are refluxed and stirred for 16 h. Excess of $SOCl_2$ is evaporated and 1H,1H,2H,2H-Perfluorodecylchlorodi(ethoxy)silane isolated by vacuum-distillation.

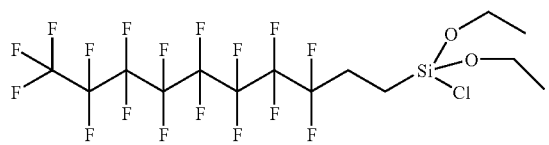

Though this example is not using Methods A, B or C, method C could be used to add a second organic group (replacing the Cl group), or Methods A and B could be used replace an ethoxy group in the starting material with an additional organic group. Also, the starting material could be made by Methods A, B or C (starting earlier with a tetraethoxysilane and reacting as in the other examples herein).

EXAMPLE 23

Making a Compound I Via Method A

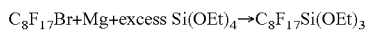

250 g (0.501 mol) 1-Bromoperfluorooctane (or 273.5 g, 0.501 mol 1-Iodoperfluorooctane), 13.39 g (0.551 mol) magnesium powder, small amount of iodine (15 crystals) and 363 mL (2.004 mol, 339.00 g) tetraethoxysilane are mixed together at room temperature and diethylether is added dropwise to the vigorously stirred solution until an exothermic reaction is observed (~200 mL). After stirring at room temperature for 16 h diethylether is evaporated. An excess of n-heptane (~400 mL) is added to precipitate the magnesium salts. Solution is filtrated and evaporated to dryness. The residue is fractionally distilled under reduced pressure to yield perfluorooctyltriethoxysilane.

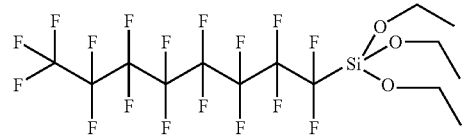

EXAMPLE 24

Making a Compound IV Via Method A

Follow the steps in Example 23, then 174.7 g (0.300 mol) perfluorooctyltriethoxysilane, 131 mL (1.800 mol, 214.1 g) thionylchloride and 4.51 g (0.039 mol) pyridinium hydrochloride are refluxed and stirred for 16 h.

Excess of SOCl$_2$ is evaporated and perfluorooctyltrichlorosilane isolated by vacuum-distillation.

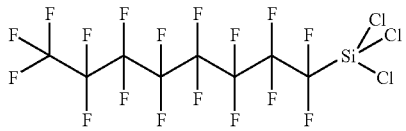

EXAMPLE 25

Making a Compound I Via Method A

CF$_2$=CF—O—CF$_2$—CF$_2$—Br+Mg+excess Si(OEt)$_4$→CF$_2$=CF—O—CF$_2$—CF$_2$—Si(OEt)$_3$ 138.47 g (0.500 mol) 2-Bromotetrafluoroethyl trifluorovinyl ether, 13.37 g (0.550 mol) magnesium powder, small amount of iodine (10 crystals) and 362 mL (2.000 mol, 338.33 g) tetraethoxysilane are mixed together at room temperature and diethylether is added dropwise to the vigorously stirred solution until an exothermic reaction is observed (~200 mL). After stirring at room temperature for 16 h diethylether is evaporated. An excess of n-heptane (~400 mL) is added to precipitate the magnesium salts. Solution is filtrated and evaporated to dryness. The residue is fractionally distilled under reduced pressure to yield tetrafluoroethyl trifluorovinyl ether triethoxysilane.

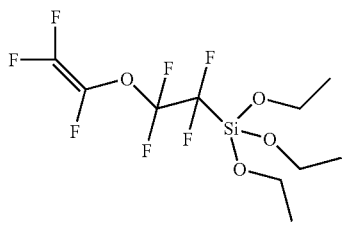

EXAMPLE 26

Making a Compound IV Via Method A

Follow steps in Example 25, followed by 108.1 g (0.300 mol) tetrafluoroethyl trifluorovinyl ether triethoxysilane, 131 mL (1.800 mol, 214.1 g) thionylchloride and 4.51 g (0.039 mol) pyridinium hydrochloride are refluxed and stirred for 16 h. Excess of SOCl$_2$ is evaporated and tetrafluoroethyl trifluorovinyl ether trichlorosilane is isolated by vacuum-distillation.

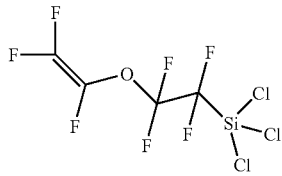

EXAMPLE 27

Making a Compound I Via Method B

CF≡C—Li+ClSi(OEt)$_3$→CF≡C—Si(OEt)$_3$+LiCl 30.80 g (0.155 mol) ClSi(OEt)$_3$ in Et$_2$O is slowly added to solution of CF≡C—Li (0.155 mol, 7.744 g, prepared in situ) in Et$_2$O at −78° C. Reaction mixture is stirred overnight allowing it slowly warm to room temperature. LiCl is removed by filtration and solution evaporated to dryness to result fluoroacetylenetriethoxysilane.

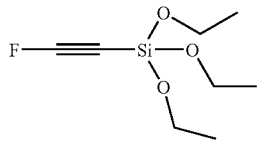

EXAMPLE 28

Making a Compound VIII Via Method C (C$_6$F$_5$)$_2$Si(OEt)$_2$+SOCl$_2$→(C$_6$F$_5$)$_2$Si(OEt)Cl+EtCl+SO$_2$ C$_6$F$_5$Li+(C$_6$F$_5$)$_2$Si(OEt)Cl→(C$_6$F$_5$)$_3$SiOEt+LiCl (C$_6$F$_5$)$_3$SiOEt+SOCl$_2$→(C$_6$F$_5$)$_3$SiCl+EtCl+SO$_2$ 180.93 g (0.400 mol) di(pentafluorophenyl)diethoxysilane, 29 mL (0.400 mol, 47.6 g) thionylchloride and 4.92 g (0.0426 mol) pyridinium hydrochloride are refluxed and stirred for 16 h. Unreacted SOCl$_2$ is evaporated and di(pentafluorophenyl)chloroethoxysilane isolated by vacuum distillation.

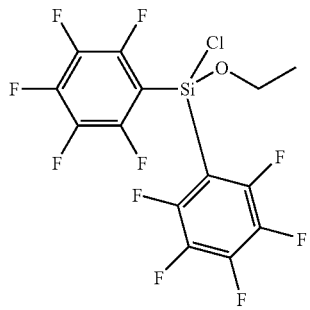

88.54 g (0.200 mol) of di(pentafluorophenyl)chloroethoxysilane in Et$_2$O is slowly added to solution of C$_6$F$_5$—Li (0.200 mol, 34.80 g, prepared in situ) in Et$_2$O at −78° C. The solution is stirred for over night allowing it to warm up to room temperature. Formed clear solution is filtered and evaporated to dryness to result tri(pentafluorophenyl)ethoxysilane, (C$_6$F$_5$)$_3$SiOEt.

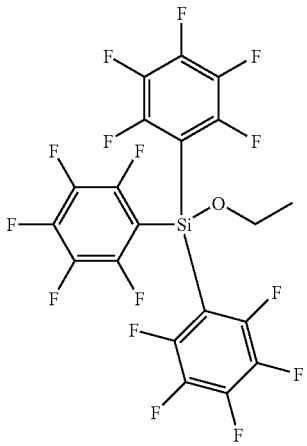

EXAMPLE 29

Making a Compound IX Via Method C

Follow steps in Example 28, followed by 114.86 g (0.200 mol) tri(pentafluorophenyl)ethoxysilane, 14.6 mL (0.200 mol, 23.8 g) thionylchloride and 2.46 g (0.0213 mol) pyridinium hydrochloride are refluxed and stirred for 16 h. Unreacted $SOCl_2$ is evaporated and tri(pentafluorophenyl)chlorosilane isolated by vacuum-distillation.

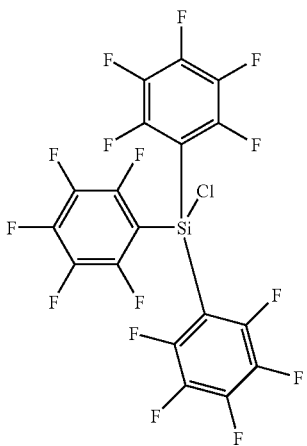

In addition to altering the organic groups in the above examples, it is of course also possible to use other reagents in the methods above. For example, in place of diethyl ether, other solvents such as THF could be used. In place of n-heptane (in Method A) other non polar solvents such as n-hexane could be used. And in place of thionyl chloride (for replacing one or more alkoxy groups with a halogen), chlorine, hydrochloric acid, hydrobromic acid, thionylbromide, chlorine or sulfurylchloride could be used. Also, the temperatures and times (and other process parameters) can be varied as desired. In one example, it is preferred that the molar ratio of the starting material to $R^2X^1$ (Methods B or C) is 0.5:1 to 2:1—preferably 1:1. Also, the starting material and $R^2X^1$ are preferably mixed at a temperature less than −40 C. degrees, e.g., between −50 C. and −100 C. and warmed to a higher temperature over a period of four hours or more (this higher temperature can be room temperature or higher if desired)—or over a longer period of time such as overnight.

As can be seen from the examples above, Methods B and C involve reacting a first compound (having an M group selected from group 14 of the periodic table, 0, 1 or 2 organic groups bound to M) with a second compound (having an element from group 1 of the periodic table and a "new" organic group). As can also be seen from the above, such a reaction can take place if the first compound has alkoxy groups bound to M or both alkoxy and halogens (0, 1 or 2 halogens) bound to M. Method C, as mentioned earlier, is a variation of Method B—and both methods can be viewed as comprising: reacting a compound of the general formula $R^1_{4-m}MOR^3_{m-n}X_n$, where $R^1$ is any nonfluorinated (including deuterated) or partially or fully fluorinated organic group (preferably a partially or fully fluorinated aryl, alkenyl, alkynyl or alkyl group) as set forth above, where M is selected from group 14 of the periodic table, where X is a halogen, where $OR^3$ is an alkoxy group, where m=2 to 4 and n=0 to 2. $R^1_{4-m}MOR^3_{m-n}X_n$ is reacted with $R^2X^1$ where $R^2$ is selected from alkyl, alkenyl, aryl or alkynyl (and where $R^2$ is fluorinated (fully or partially), and where $X^1$ is an element from group 1 of the periodic table. $X^1$ is preferably Na, Li or K, more preferably Na or Li, and most preferably Li. M is preferably Si, Ge or Sn, more preferably Si or Ge, and most preferably Si. X is preferably Cl, Br or I, more preferably Cl or Br, and most preferably Cl. $OR^3$ is preferably an alkoxy group having from 1 to 4 carbon atoms, more preferably from 1 to 3 carbons, and most preferably 2 carbons (ethoxy). Also, "m" is preferably 3 or 4, whereas "n" is preferably 0 or 1.

$R^1$ and $R^2$ are independently preferably partially or fully fluorinated (though not necessarily as can be seen in prior examples) organic groups such as an aryl group (by aryl group we mean any organic group having a ring structure) though preferably a five or six carbon ring that is unsubstituted or substituted. For a six carbon ring structure, 1, 2 or 3 substituents can be bound to the ring, which substituents can be actively bound to the ring via a variation on the Method C set forth above (to be described further below). The substituents can be alkyl groups of any desired length, straight or branched chain, preferably fluorinated, and preferably having from 1 to 4 carbon atoms. Or the substituents on the ring structure can comprise a C═C double bond and be an alkenyl group (by alkenyl group we mean any organic group with a C═C double bond) such as an acrylate, vinyl or allyl group. A fluorinated vinyl, methyl or ethyl group on a fluorinated phenyl group are examples. Or, the aryl group could be a multi ring structure (e.g., perfluoronaphthalene or a biphenyl group). Or $R^1$ and $R^2$ could independently be an alkenyl group such as a vinyl or longer chain group having a C═C double bond, or a group having other types of double bonds (e.g., C═O double bonds or both C═C and C═O double bonds) such as acrylate and methacrylate groups. $R^1$ and $R^2$ could also be an alkynyl group (by alkynyl group we mean any organic group with a carbon-carbon triple bond). as mentioned previously, as well as an alkyl group. If an alkyl group (by alkyl group we mean a carbon chain of any length), preferably the carbon chain is from 1 to 14, and more preferably from 4 to 8. Perfluorinated alkyl groups from 1 to 8 carbons can be used, as well as fluorinated (e.g., partially fluorinated) groups longer than 8 carbons. All the organic groups above could be deuterated in stead of fluorinated (or partially deuterated and partially fluorinated), though fully or partially fluorinated (particularly fully fluorinated) is preferred.

In Method C set forth above, an organic (or hybrid) group "R" (e.g., $R^2$) becomes bound to a group 3-6 or 13-16 element "M" by replacing a halogen "X" bound to "M" via the specified reaction. In an alternative to this method (Method D), an organic (or hybrid) group "R" (e.g., $R^1$) comprises the halogen "X"—preferably Cl or Br (rather than "X" being bound to "M"). Thus, when the reaction is performed, $R^2$ replaces X bound to $R^1$, such that $R^2$ becomes bound to R1 (which is in turn bound to M). Preferably the other groups bound to M are alkoxy groups ($OR^3$) or other organic groups. More particularly, such a method comprises providing a compound $X_a R^1 MOR^3{}_2 R^4$ where a is from 1 to 3, X is a halogen(s) bound to $R^1$, $R^1$ is an organic group (preferably an aryl, alkyl, alkenyl or alkynyl—more preferably an alkyl or aryl group), $OR^3$ is an alkoxy, and $R^4$ is either an additional alkoxy group or an additional organic group (selected from aryl, alkyl, alkenyl or alkynyl), and reacting this compound with $R^2 M^1$ where $M^1$ is selected from group 1 of the periodic table and $R^2$ is an organic group preferably selected from aryl, alkyl, alkenyl and alkynyl, etc., so as to form $R^2{}_a R^1 MOR^3{}_2 R^4$.

In one example, $R^4$ is an alkoxy group the same as $OR^3$, such that the method comprises reacting $X_a R^1 MOR^3{}_3$ with $R^2 M^1$ to form $R^2{}_a R^1 MOR^3{}_3$ (where $R^1$ and $OR^3$ are bound to M and $R^2$ is bound to $R^1$. In another example, $R^4$ is an organic group selected from aryl, alkyl, alkenyl and alkynyl. Preferably $OR^3$ is a methoxy, ethoxy or propoxy, $R^1$ is an aryl or alkyl (straight or branched chain) having from 1 to 14 carbons, and $R^2$ is an aryl, alkyl, alkenyl or alkynyl, where a=1 or 2 if $R^1$ is an alkyl and a=1, 2 or 3 if $R^1$ is an aryl group. $R^2$ can be an epoxy, acrylate, methacrylate, vinyl, allyl or other group capable of cross linking when exposed to an electron beam or in the presence of a photoinitiator and electromagnetic energy (e.g., UV light).

EXAMPLE A

Forming a Compound I or IV Via Method D

1.

$$1,4\text{-}Br_2C_6F_4 + Mg + Si(OEt)_4 \longrightarrow Br(C_6F_4)Si(OEt)_3$$

2.

$$Br(C_6F_4)Si(OEt)_3 + CF_2{=}CFLi \longrightarrow (CF_2{=}CF)(C_6F_4)Si(OEt)_3$$

3.

$$(CF_2{=}CF)(C_6F_4)Si(OEt)_3 + \text{excess SOCl}_2 \xrightarrow{\text{py-HCl}} (CF_2{=}CF)(C_6F_4)SiCl_3$$

250 g (0.812 mol) 1,4-dibromotetrafluorobenzene, 21.709 g (0.8932 mol) magnesium powder, small amount of iodine (15 crystals) and 181 mL (0.812 mol, 169.164 g) tetraethoxysilane were mixed together at room temperature and diethylether was added dropwise to the vigorously stirred solution until an exothermic reaction was observed (~250 mL). After stirring at room temperature for 16 h diethylether was evaporated. An excess of n-heptane (~600 mL) was added to precipitate the magnesium salts. Solution was filtrated and evaporated to dryness. The residue was fractionally distilled under reduced pressure to yield 4-bromotetrafluorophenyltriethoxysilane.

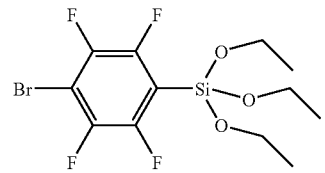

78.246 g (0.200 mol) 4-bromotetrafluorophenyltriethoxysilane in $Et_2O$ is slowly added to solution of $CF_2{=}CF{-}Li$ (0.200 mol, 17.592 g, prepared in situ) in $Et_2O$ at −78° C. Reaction mixture is stirred overnight while it will slowly warm to room temperature. LiBr is removed by filtration and the product, 4-triethoxysilyl-perfluorostyrene, purified by distillation.

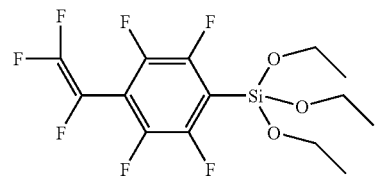

117.704 g (0.300 mol) 4-triethoxysilylperfluorostyrene, 131 mL (1.800 mol, 214.1 g) thionylchloride and 4.51 g (0.039 mol) pyridinium hydrochloride were refluxed and stirred for 16 h. Excess of $SOCl_2$ was evaporated and 4-trichlorosilyl-perfluorostyrene isolated by vacuum-distillation.

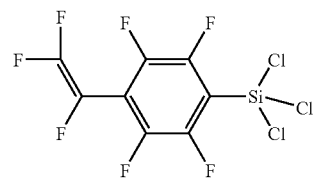

The above example could be modified where 2 or 3 halogens (in this case Br) are bound to the phenyl group so as to result in multiple vinyl substituents. Also, the phenyl group could be another organic group such as an straight or branched chain alkyl group, a multi ring aryl group, etc., whereas the vinyl group could be any suitable organic group capable of binding to a group I element (in the above example Li) and replacing the halogen (in the above example Br). Examples other than vinyl include methyl, ethyl, propyl, phenyl, epoxy and acrylate.

EXAMPLE B

Forming a Compound I Via Method D

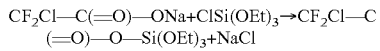

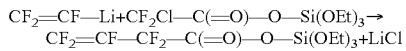

15.246 g (0.10 mol) sodium chlorodifluoroacetate, is dissolved to 100 mL $Et_2O$ and cooled to −70° C. 19.7 mL (0.10 mol, 19.872 g) chlorotriethoxysilane in $Et_2O$ (50 mL) was added dropwise to reaction solution. The solution was stirred for over night allowing it to warm up to room temperature. NaCl is removed by filtration and solution evaporated to dryness to result clear colourless liquid, chlorodifluoroacetic acid, triethoxysilyl ester.

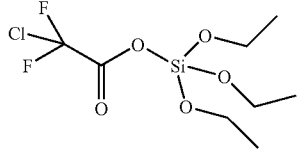

29.27 g (0.10 mol) chlorodifluoroacetic acid, triethoxysilyl ester, is dissolved to 100 mL $Et_2O$ and slowly added to solution of $CF_2$=CF—Li (0.10 mol, 8.796 g, prepared in situ) in $Et_2O$ at −78° C. Reaction mixture is stirred overnight allowing it slowly warm to room temperature. LiCl is removed by filtration and solution evaporated to dryness to result yellow liquid, crude perfluoro-3-butene acid, triethoxysilyl ester.

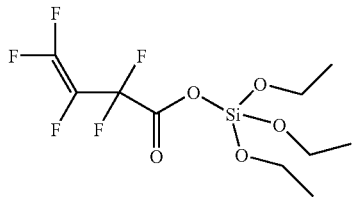

EXAMPLE C

Forming a Compound I or IV Via Method D

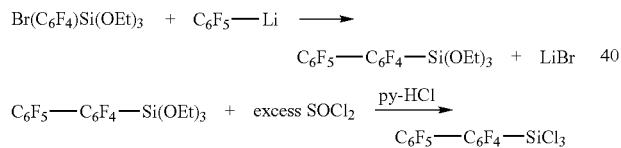

78.246 g (0.200 mol) 4-bromotetrafluorophenyltriethoxysilane in $Et_2O$ is slowly added to solution of $C_6F_5$—Li (0.200 mol, 34.80 g, prepared in situ) in $Et_2O$ at −78° C. Reaction mixture is stirred overnight while it will slowly warm to room temperature. LiBr is removed by filtration and the product, perfluorobiphenyltriethoxysilane, purified by distillation.

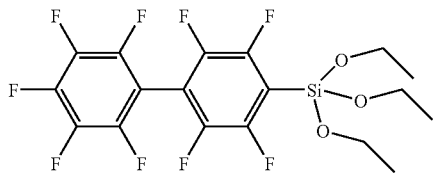

143.516 g (0.300 mol) perfluorobiphenyltriethoxysilane, 131 mL (1.800 mol, 214.1 g) thionylchloride and 4.51 g (0.039 mol) pyridinium hydrochloride were refluxed and stirred for 16 h. Excess of $SOCl_2$ was evaporated and perfluorobiphenyltrichlorosilane isolated by vacuum-distillation.

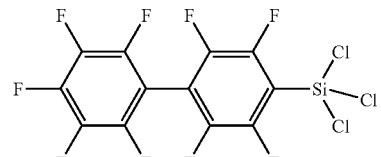

EXAMPLE D

Forming a Compound I or IV Via Method D

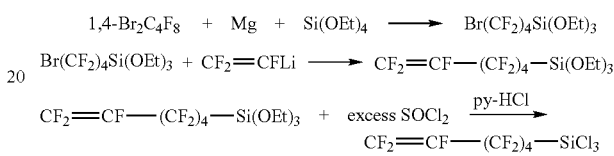

143.94 g (0.40 mol) 1,4-dibromooctafluorobutane, 10.69 g (0.44 mol) magnesium powder, small amount of iodine (15 crystals) and 88 mL (0.40 mol, 82.42 g) tetraethoxysilane were mixed together at room temperature and diethylether was added dropwise to the vigorously stirred solution until an exothermic reaction was observed (~200 mL). After stirring at room temperature for 16 h diethylether was evaporated. An excess of n-heptane (~400 mL) was added to precipitate the magnesium salts. Solution was filtrated and evaporated to dryness. The residue was fractionally distilled under reduced pressure to yield 4-bromooctafluorobutanetriethoxysilane.

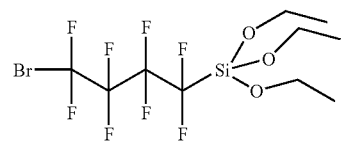

88.641 g (0.200 mol) 4-bromooctafluorobutanetriethoxysilane in $Et_2O$ is slowly added to 1.5 solution of $CF_2$=CF—Li (0.200 mol, 17.592 g, prepared in situ) in $Et_2O$ at −78° C. Reaction mixture is stirred overnight while it will slowly warm to room temperature. LiBr is removed by filtration and the product, perfluoro-1-hexenetriethoxysilane, purified by distillation.

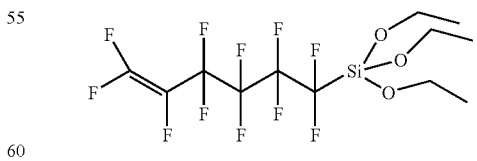

133.295 g (0.300 mol) perfluoro-1-hexenetriethoxysilane, 131 mL (1.800 mol, 214.1 g) thionylchloride and 4.51 g (0.039 mol) pyridinium hydrochloride were refluxed and stirred for 16 h. Excess of $SOCl_2$ was evaporated and perfluoro-1-hexenetrichlorosilane isolated by vacuum-distillation.

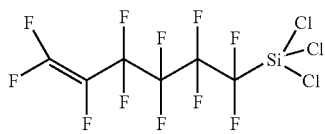

In the above "Method D" examples, $R^1$, $R^2$, $R^3$ and $R^4$ are preferably partially or fully fluorinated.

Hydrolysis and Condensation of the Compound(s)

Compounds IV, VII and IX have organic (or hybrid) R group(s) and halogen(s) (preferably Br or Cl) bound to M (selected from groups 3-6 or 13-16—preferably group 14)). These compounds can be hydrolyzed alone or in any combination to result in a material having a -M-O-M- O— backbone with R groups bound to the backbone, and that preferably has a molecular weight of from 500 to 100,000. In one example, a compound selected from Compound IV is hydrolyzed with another compound selected from Compound IV. In another example, a single compound from Compound VII is hydrolyzed. Many other combinations are possible, including: a) Compound IV+Compound VII; b) Compound IV+Compound IV+Compound IV; c) Compound VII+Compound VII; d) Compound IV+Compound VII+Compound IX; e) Compound IV+Compound IV+Compound IX; f) Compound VII+Compound IX, etc. Any other combinations, in any desired ratio, can be used for the hydrolysis and eventual deposition.

The hydrolysis/condensation procedure can comprise five sequential stages: Dissolve, hydrolysis and co-condensation, neutralization, condensation and stabilization. Not all stages are necessary in all cases. In the hydrolysis, chlorine atoms are replaced with hydroxyl groups in the silane molecule. The following description takes as an example compounds that have chlorine as the halogen that takes part in the hydrolysis reaction, and silicon is the metal in the compound. Hydrochloric acid formed in the hydrolysis is removed in the neutralization stage. Silanols formed in the hydrolysis are attached together for a suitable oligomer in the condensation stage. The oligomer formed in the condensation are stabilized in the end. Each stage can be done with several different ways.

EXAMPLE I

Dissolving. Chlorosilanes are mixed together in an appropriate reaction container and the mixture is dissolved into a suitable solvent like tetrahydrofuran. Instead of tetrahydrofuran as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. The reaction mixture is cooled to 0° C. The hydrolysis is performed by adding water ($H_2O$) into the reaction mixture. The water is added in 1:4 (volume/volume) water-tetrahydrofuran-solution. Water is used equimolar amount as there are chlorine atoms in the starting reagents. The reaction mixture is held at 0° C. temperature during the addition. The reaction mixture is stirred at room temperature for 1 hour after addition. Instead of tetrahydrofuran water used in the reaction can be dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. The reaction mixture is neutralized with pure sodium hydrogen carbonate. $NaHCO_3$ is added into cooled reaction mixture at 0° C. temperature ($NaHCO_3$ is added equimolar amount as there is hydrochloric acid in the reaction mixture). The mixture is stirred at the room temperature for a while. After the pH of the reaction mixture has reached value 7, the mixture is filtered. The solvent is then evaporated with rotary evaporator.

Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, methylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Neutralization stage in cases where condensation stage is passed: In the neutralization stage evaporation of the solvent in the end is not necessary always. In these cases this stage is aborted after filtering (the reaction mixture is neutral) and the synthesis is continued in stabilization stage (the condensation stage is passed).

Condensation. The material is stirred with magnetic stirrer bar under 12 mbar pressure for few hours. Water, which forms during this final condensation, evaporates off. The pressure in this stage can be in a large range. The material can be heated while vacuum treatment. Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic acid, trichloro acetic acid, dichloro acetic acid, monobromo acetic acid. The solution is refluxed for few hours or until polymerization is reached desired level while water formed in the reaction is removed. After polymerization, acid catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally solvent is removed.

Stabilization. The material is dissolved into cyclohexanone, which is added 30 weight-% of the materials weight. The pH of the solution is adjusted to value 2.0 with acetic acid. In the place of cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic acid, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Stabilization in cases when the condensation stage is bypassed: Acetic acid is added into the mixture until a pH value of 3-4 is reached. The solution is evaporated until appropriate concentration of the oligomer in the solution has reached (about 50 w-% oligomer, 49 w-% solvent and 1 w-% acid, "solvent" is the solvent of the dissolving and hydrolysis stages).

In Example I above, "chlorosilanes" are initially mixed together with tetrahydrofuran. As mentioned earlier, this can be an almost unlimited number and type of compounds as disclosed in detail earlier herein—including a large number of chlorosilanes and other halo-metal-organic compounds in accordance with the invention and in accordance with the ultimate properties desired in the final material. If one of the compounds to be hydrolyzed and condensed is pentafluorophenyltrichlorosilane, this can be prepared as in the methods set forth above, by:

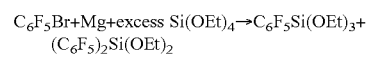

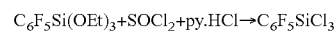

100 mL (0.8021 mol, 198.088 g) pentafluorobromobenzene, 24.90 g (1.024 mol) magnesium powder and 716 mL (3.2084 mol, 668.403 g) tetraethoxysilane are mixed together at room temperature and diethylether is added dropwise to the vigorously stirred solution until an exothermic reaction is observed (~200 mL). After stirring at 35° C. for 16 h the mixture is cooled to room temperature and diethylether evaporated. An excess of n-heptane (~500 mL) is added to precipitate the magnesium salts. Solution is filtrated and evaporated to dryness. The residue is fractionally distilled under reduced pressure to yield pentafluorophenyltriethoxysilane.

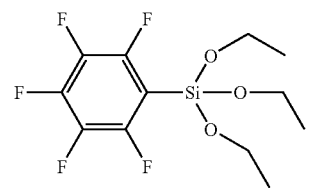

100 mL (0.375 mol, 124.0 g) pentafluorophenyltriethoxysilane, 167 mL (2.29 mol, 272.0 g) thionylchloride and 5.63 g (0.0487 mol) pyridinium hydrochloride are refluxed and stirred for 24 h. Excess of SOCl$_2$ is evaporated and pentafluorophenyltrichlorosilane

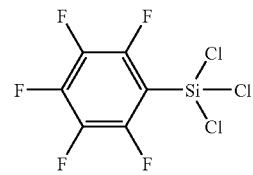

isolated by vacuum-distillation.

If a second of the compounds to be hydrolyzed and condensed is trifluorovinyltrichlorosilane, this can be prepared by:

119 mL (0.155 mol) sec-butyllithium (1.3 M solution in cyclohexane) is added under argon with stirring to 18.053 g (0.155 mol) chlorotrifluoroethylene

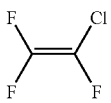

dissolved in Et$_2$O at −80° C. After the addition is complete the reaction mixture is stirred for 15 min to yield lithiumtrifluoroethylene.

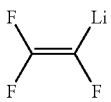

30.80 g (0.155 mol) ClSi(OEt)$_3$ in Et$_2$O is slowly added to solution of CF$_2$=CF—Li (0.155 mol, 13.633 g, prepared in situ) in Et$_2$O at −78° C. Reaction mixture is stirred overnight while it will slowly warm to room temperature. LiCl is removed by filtration and the product, trifluorovinyltriethoxysilane,

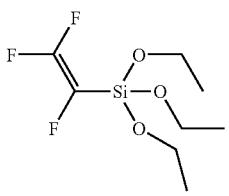

is isolated by distillation.

24.4 g (0.100 mol) trifluorovinyltriethoxysilane, 44 mL (0.60 mol, 71.4 g) thionylchloride and 0.497 g (0.0045 mol) pyridinium hydrochloride are refluxed and stirred for 24 h. Excess of SOCl$_2$ is evaporated and trifluorovinyltrichlorosilane

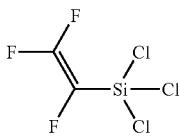

is purified by distillation.

Then, to a solution of trifluorovinyltrichlorosilane and pentafluorophenyltrichlorosilane at a molar ratio 1:1 in dehydrated tetrahydrofuran, is added dropwise a stoichiometric amount of water (e.g., H2O or D2O), in THF at 0° C. (nonstoichiometric amounts, higher or lower, can also be used). After stirring for 1 hour, the solution is neutralized with 3 equivalents of sodium hydrogencarbonate. After confirming the completion of generation of carbonic acid gas from the reaction solution, the solution is filtered and volatile compounds are removed by vacuum evaporation to obtain colorless, transparent viscous liquid, poly(pentafluorophenyltrifluorovinyl-siloxane), in a three dimensional network of alternating silicon and oxygen atoms.

EXAMPLE II

Dissolving. Vinyl trichlorosilane (64.89 g, 402 mmol, 50 mol %) and phenyl trichlorosilane (85.00 g, 402 mmol, 50 mol %) are dissolved in dehydrated THF.

Hydrolysis. The solution is cooled down to 0° C. Water (43.42 g, 2.41 mol, 300 mol %) is added slowly dropwise in THF (1:4 V:V) into stirred solution. The solution is then stirred for 1 hour at the room temperature.

Neutralization. The solution is cooled down to 0° C. and sodium hydrogen carbonate (202.53 g, 2.41 mol, 300 mol %) is added slowly. The solution is stirred after addition at the room temperature until pH of the mixture is neutral.

Condensation. The solution is then filtered and solvents are evaporated with rotary evaporator. After evaporation the mixture is stirred at the room temperature under high vacuum until refractive index of the material is 1.5220.

Stabilization. After vacuum treatment dehydrated THF (5 w-%) and MIBK (20 w-%) are added into the material for solvents and the material is dissolved. Appropriate initiators are added and dissolved into the mixture. Finally, the material is filtered.

Alternative Procedures for Each Stage

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic add. In the place of water following reagents can be used: deuterium oxide (D$_2$O) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate (NaHCO$_3$) neutralization (removal of hydrochlorid acid) can be performed using following chemicals: pure potassium hydrogen carbonate (KHCO$_3$), ammonium hydrogen carbonate (NH$_4$HCO$_3$), sodium carbonate (Na$_2$CO$_3$), potassium carbonate (K$_2$CO$_3$), sodium hydroxide (NaOH), potassium hydroxide (KOH), calcium hydroxide (Ca(OH)$_2$), magnesium hydroxide (Mg(OH)$_2$) ammonia (NH$_3$), trialkylamines (R$_3$N, where R is hydrogen or straight/branched chain C$_x$H$_y$, x<10, as for example in triethylamine, or heteroatom containing as for example in triethanol amine), trialkyl ammonium hydroxides (R$_3$NOH, R$_3$N, where R is hydrogen or straight/ branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, methylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solvent is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for add catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of acid such as: triflic acid, monofluoro acetic acid, trifluoro acetic add, trichloro acetic add, dichloro acetic add, monobromo acetic add. The solution is refluxed for few hours or until polymerization is reached desired level while water formed in the reaction is removed. After polymerization, add catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally solvent is removed.

Stabilization. In the place of THF and MIBK can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic add, formic add, propanoic add, monofluoro acetic acid, trifluoro acetic acid, trichloro acetic add, dichloro acetic acid, monobromo acetic add. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis(pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

EXAMPLE III

Dissolve. Pentafluorophenyl vinyl dichlorosilane (54.85 g, 187 mmol, 58 mol %), pentafluorophenyl trichlorosilane (24.32 g, 81 mmol, 25 mol%), acryloxypropyl trichlorosilane (5.59 g, 23 mmol, 7 mol %) and dimethyl dimethoxysilane (3.88 g, 32 mmol, 10 mol %) are dissolved in dehydrated THF.

Hydrolysis. The solution is cooled down to 0° C. and water (12.32 g, 684 mmol, 212 mol %) is added dropwise in THF (1:4 V:V) into stirred solution. The solution is stirred for 1 hour at the room temperature after addition.

Neutralization. The solution is cooled down to 0° C. Sodium hydrogen carbonate (57.46 g, 684 mmol, 212 mol %) is added slowly into this mixed solution. The solution is stirred after addition at the room temperature until pH of the mixture is neutral.

Condensation. The solution is then filtered and solvents are evaporated. After evaporation the mixture is stirred under high vacuum until refractive index of the material is 1.4670.

Stabilization. After vacuum treatment dehydrated THF (5 w-%) and cyclohexanone (40 w-%) are added for solvents and the material is dissolved. The solution is acidified to pH value 2.0. Appropriate initiators are added and dissolved into the mixture. Finally, the material is filtered.

Alternative Procedures for Each Stage

Dissolve. Instead of tetrahydrofuran (THF) as solvent you can use any pure solvent or mixture of solvents (alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methylisobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol di methyl ether, 2-propanol, toluene, dichloromethane. The formed solution is evaporated to dryness. The material is dissolved again into the same mixture of water and the solvent Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or acid catalyzed polymerizations. Procedure for add catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of add such as: triflic add, monofluoro acetic add, trifluoro acetic acid, trichloro acetic acid, dichloro acetic add, monobromo acetic add. The solution is refluxed for few hours or until polymerization is reached desired level while water formed in the reaction is removed. After polymerization, acid catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic add, formic add, propanoic acid, monofluoro acetic acid, trifluoro acetic acid, trichloro acetic acid, dichloro acetic acid, monobromo acetic add. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis(pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

EXAMPLE IV

Dissolve. Pentafluorophenyl vinyl dichlorosilane (122.96 g, 420 mmol, 58 mol %), pentafluorophenyl trichlorosilane (54.54 g, 181 mmol, 25 mol %), acryloxypropyl trichlorosilane (12.54 g, 51 mmol, 7 mol %) and di(pentafluorophenyl) dichlorosilane (31.33 g, 72 mmol, 10 mol %) are dissolved in dehydrated THF.

Hydrolysis. The solution is cooled down to 0° C. and water (30.27 g, 1.68 mol, 232 mol %) is added dropwise in THF (1:4 V:V) into stirred solution. The solution is then stirred for 1 hour at the room temperature.

Neutralization. The solution is cooled down to 0° C. and sodium hydrogen carbonate (140.97 g, 1.68 mol, 232 mol %)

is added slowly. The solution is stirred after addition at the room temperature until pH of the mixture is neutral.

Condensation. The solution is then filtered and solvents are evaporated. After evaporation the mixture is stirred under high vacuum until refractive index of the material is 1.4705.

Stabilization. After vacuum treatment dehydrated THF (5 w-%) and cyclohexanone (40 w-%) are added for solvents and the material is dissolved. The solution is acidified to pH value 20 with trifuoro acetic acid. Appropriate initiators are added and dissolved into the mixture. Finally, the material is filtered.

Alternative Procedures for Each Stage

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methylisobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or add catalyzed polymerizations. Procedure for add catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methylisobutyl ketone. Into the solution material solution is added catalytic amount of add such as: triflic add, monofluoro acetic add, trifluoro acetic add, trichloro acetic acid, dichloro acetic add, monobromo acetic acid. The solution is refluxed for few hours or until polymerization is reached desired level while water formed in the reaction is removed. After polymerization, add catalyst is removed from the material solution completely for example using solvent extraction or other methods described in alternative neutralization section. Finally, solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic add, formic add, propanoic add, monofluoro acetic acid, trifluoro acetic add, trichloro acetic add, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis(pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

EXAMPLE V

Dissolve. Pentafluorophenyl vinyl dichlorosilane (90.00 g, 307 mmol, 60 mol %), pentafluorophenyl trichlorosilane (38.59 g, 128 mmol, 25 mol %) and di(pentafluorophenyl) dichlorosilane (33.25 g, 77 mmol, 15 mol %) are dissolved in dehydrated THF.

Hydrolysis. The solution is cooled down to 0° C. and water (20.72 g, 1.15 mol, 225 mol %) is added dropwise in THF (1:4 V:V) into this stirred solution. The solution is then stirred for 1 hour at the room temperature.

Neutralization. The solution is cooled down to 0° C. and sodium hydrogen carbonate (96.74 g, 1.15 mol, 225 mol %) is added slowly. The solution is stirred after addition at the room temperature until pH of the mixture is neutral.

Condensation. The solution is then filtered and solvents are evaporated. After evaporation the mixture is stirred under high vacuum until refractive index of the material is 1.4715.

Stabilization. After vacuum treatment dehydrated THF (5 w-%) and cyclohexanone (40 w-%) are added for solvents and the material is dissolved. The solution is acidified to pH value 2.0 with trifluoro acetic acid. Appropriate initiators are added and dissolved into the mixture. Finally, the material is filtered.

Alternative Procedures for Each Stage

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic add. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid add) can be performed using following chemicals: pure potassium hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment. Molecular weight of formed polymer can be increased in this stage by using base or add catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methylisobutyl ketone. Into the solution material solution is added catalytic amount of add such as: triflic acid, monofluoro acetic acid, trifluoro acetic acid, trichloro acetic add, dichloro acetic add, monobromo acetic acid. The solution is refluxed for few hours or until polymerization is reached desired level while water formed in the reaction is removed. After polymerization, add catalyst is removed from the material solution completely for example using solvent extraction or other methods described in alternative neutralization section. Finally, solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methylisobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic acid, formic acid, propanoic add, monofluoro acetic acid, trifluoro acetic acid, trichloro acetic acid, dichloro acetic acid, monobromo acetic acid. Also following basic compounds can be added into the material solution: triethyl amine, triethanol amine, pyridine, N-methyl pyrrolidone.

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as 1,4-bis(pentafluorobenzoyl)benzene or Rhodosil 2074. Thermal initiators which can be used are benzoyl peroxide, 2,2'-azobisisobutyronitrile, 1,1'-Azobis(cyclohexanecarbo-nitrile), tert-butyl hydroperoxide, Dicumyl peroxide and Lauroyl peroxide.

Example I above is but one example of a method comprising: reacting a compound of the general formula $R1MX3_3$ with a compound of the general formula $R2MX3_3$ where R1 is selected from alkyl, alkenyl, aryl and alkynyl, R2 is selected from alkenyl, aryl or alkynyl, M is an element selected from groups 3-6 or 13-16 though preferably from group 14 of the periodic table, and X3 is a halogen; with H2O or D2O; so as to form a compound having a molecular weight of from 500 to 100,000 with a -M-O-M-O— backbone with R1 and R2 substituents on each M. In the hydrolysis example above, silicon atoms of the network are modified by pentafluorophenyl and trifluorovinyl groups in an approximate ratio 1:1. Of course other ratios are possible depending upon the ratio of starting materials, and, of course, other three dimensional networks can be achieved by having other (or additional) starting materials selected from Compound IV, VII and IX, along with other hydrolyzable materials. An alternate example is a method comprising: reacting a compound of the general formula $R1R2MX3_2$ where R1 is selected from alkyl, alkenyl, aryl and alkynyl, R2 is selected from alkenyl, aryl or alkynyl, M is an element selected from group 14 of the periodic table, and X3 is a halogen; with D2O; so as to form a compound having a molecular weight of from 500 to 100,000 with a -M-O-M-O— backbone with R1 and R2 substituents on each M. As mentioned above, Compounds IV, VII and IX have organic (or hybrid) R group(s) and halogen(s) (preferably Br or Cl) bound to M (selected from groups 3-6 or 13-16—preferably group 14)) and can be combined in almost limitless combinations—e.g., a compound selected from the Compound IV group could be hydrolyzed with another compound selected from Compound IV. In another example, a single compound from Compound VII is hydrolyzed. Many other combinations are possible, including: Compound IV+Compound VII; Compound IV+Compound IV+Compound IV; Compound VII+Compound VII; Compound IV+Compound VII+Compound IX; Compound IV+Compound IV+Compound IX; Compound VII+Compound IX, etc.—which various combinations of compounds will result in a hydrolyzed material having at least one organic substituent bound to an inorganic oxide backbone—preferably from 2 to 6 different organic substituents bound to the backbone prior to deposition and exposure. The presence of the organic groups, preferably all fluorinated, allows for improved optical absorption characteristics due to minimal or absent C—H bonds in the deposited material (preferably the hydrolyzed/condensed material has a hydrogen content of 10% or less, preferably 5% or less, and more preferably 1% or less).

Also, though "M" in the above hydrolysis example is silicon, it is possible to have materials with other M groups, or "dope" one or more silanes to be hydrolyzed with a lesser (though not necessarily lesser) amount of a compound having a different M group such as boron, a metalloid and/or an early transition metal (e.g., B, Al, Si, Ge, Sn, Sb, Pb, Ta, Ti, Zr, Er, Yb and/or Nb). As an example, a material could be formed from hydrolyzing/condensing one or more compounds each formed of silicon, chlorine and one or more fluorinated organic compounds bound to the silicon, whereas another material could be formed by hydrolyzing/condensing such compound with one or more additional compounds that each comprise an element other than silicon (Ge, Nb, Yb etc.), chlorine and one or more fluorinated organic groups. In this way, the inorganic backbone of the hydrolyzed/condensed material will comprise silicon, oxygen and the element(s) other than silicon, with fluorinated organic groups bound to this backbone.

Though halogen (e.g., chlorine) and alkoxy (e.g., ethoxy) groups are disclosed herein as the groups bound to the "M" group (e.g., silicon) via which hydrolysis occurs, it should be noted that for some of the compounds mentioned herein, an OH group could be bound to M followed by hydrolysis and deposition as will be discussed below.

Deposition of the Hydrolyzed and Condensed Material

The material formed as above preferably has a molecular weight between 500 and 100,000. The substrate can be any suitable substrate, such as any article of manufacture that could benefit from the combined benefits of a hybrid organic-inorganic material. In the fields of electronics and optical communications, the material could be deposited as a final passivation layer, as a glob top coating, as an underfill in a flip chip process, as a hermetic packaging layer, etc., though in the present invention, the preferred application of the material is as a dielectric in an integrated circuit. In general, the siloxane oligomer—the hybrid organic-inorganic material having the molecular weight as set forth above—is mixed with a suitable solvent and deposited. The solvent can be any suitable solvent, such as isopropanol, ethanol, methanol, THF, mesitylene, toluene, cyclohexanone, cyclopentanone, dioxane, methyl isobutyl ketone, or perfluorinated toluene.

Deposition is generally at a temperature of 200 C or less (can be at 150 C or less). If the material is annealed after deposition, it is preferably at 200 C or less. If the material is to be patterned by exposure to electromagnetic radiation (e.g., UV light) then a photoinitiator can be mixed into the material along with the solvent. There are many suitable types of photoinitiators that could be used, such as Irgacure 184, Irgacure 500, Irgacure 784, Irgacure 819, Irgacure 1300, Irgacure 1800, Darocure 1173 or Darocure 4265. The initiator could be highly fluorinated, such as 1,4-bis(pentafluorobenzoyl)benzene or Rhodosil 2074 photoinitiator. Also, thermal initiators can be applied for thermal crosslinking of organic carbon double bond moieties, such as with Benzoyl peroxide, 2,2'-Azobisisobutyronitrile, or tert-Butyl hydroperoxide. The amount of these photo or thermal initiators may vary from 0.1 to 5 w-%. They may appear in solid or liquid phase. The initiator is carefully mixed with the material that already contains "processing solvent". (Organic dopants or liquid crystal dopants—or erbium—can be mixed with the material at this point if desired.) Finally, the material is filtered through inert semiconductor grade filter to remove all undissolved material.

Spin-on processing. After hydrolysis and condensation, the material solution is deposited on a substrate in a spin-on process (or by dipping, spray and meniscus coating, etc.). Both static and dynamic deposition can be used. The material is first spread over a wafer or other substrate at low speed (50 to 700 rpm) for 5 to 10 seconds and then the speed is increased by 500 to 5000 rpm/s acceleration to 1000 rpm or higher depending upon starting speed. However, slower speeds may be used if very thick films are required. If 1000 rpm spinning speed is applied film thicknesses from 100 nm to 30,000 nm are achieved depending on material viscosity. Material viscosity can be tuned by increasing the amount of process solvent, which typically have relative low vapor pressure and high boiling point. Spinning is continued for 30 to 60 seconds to obtain uniform film over the wafer. After the spinning, an edge bead removal process is accomplished and the wafer is pre-baked (in nitrogen on hot-plate or in furnace) at temperature around 100 Celsius for 1 minute to remove the process solvent (if used) and improve adhesion to the substrate or to the layer underneath of the current material. Adhesion promoter such as 1% aminopropyltrimethoxy silane in IPA or plasma activation may be applied between the main layers to improve adhesion between them.

The substrate can be any suitable substrate or article. In many cases, the substrate will be a planar wafer-type substrate, such as a glass, plastic, quartz, sapphire, ceramic or a semiconductor substrate (e.g., germanium or silicon). The substrate can have electronic or photonic circuitry already thereon prior to deposition of the dielectric material of the invention. In the present invention, a silicon wafer is the preferred substrate.

Deposition Example 1: Add 10 w-% of methyl isobutyl ketone and 1 w-% of Darocure 1173 photoinitiator to result in the formation of a spin-coatable and photo-sensitive material. The material is deposited by spin coating, spray coating, dip coating, etc. onto a substrate or other article of manufacture. As mentioned herein, many other organic groups can be used in place of the above groups, though preferably one of the groups in one of the compounds is capable of cross linking when exposed to electromagnetic energy (or an electron beam)—e.g., an organic group with a ring structure (e.g., an epoxy) or a double bond (e.g., vinyl, allyl, acrylate, etc.). And, preferably such a cross linking group is partially or fully fluorinated so that the organic cross linking groups in the material after cross linking will be fluorinated cross linking groups—ideally perfluorocarbon cross linking groups in the finally formed material.

Patterning by RIE

In the above examples, organic cross linking groups (alkenyl, alkynyl, epoxy, acrylic, etc.) are selectively exposed to light or a particle beam so as to further cross link the material in particular areas, followed by removal with developer of non-exposed areas. However, it is also possible to expose the entire material (or write the entire area with a particle beam, or heat the entire article) so as to organically cross link the material in all areas. Then, following standard processing (spin on and developing of photoresist, etc.) the material can be patterned by etching (e.g., RIE or other plasma etch process). In addition, it is possible to deposit and pattern the electrically conductive areas first, followed by deposition (and optional chemical mechanical polishing) of the dielectric material of the invention. In addition, it is not necessary to have organic cross linking groups at all. A material having a molecular weight of from 500 to 100,000 (due to partial hydrolysis of precursors as mentioned elsewhere herein) is deposited on a substrate. Then, additional hydrolysis is performed e.g., by heating the material on the substrate so as to cause additional (inorganic) cross linking of the material (i.e., extending the -M-O-M-O three dimensional backbone and substantially increasing the molecular weight). The material can then be chemical-mechanical polished and patterned by RIE or other suitable methods.

Exposure

One use of the material set forth above is as a layer within an integrated circuit. However, many other devices, from simple hybrid coatings to complex optical devices, can be formed from the materials and methods described above. Regardless of the article being formed, it will be desirable to cross link the deposited material. As mentioned above, any suitable cross linking agent can be used, including common thermal and photo initiators. Assuming that a photoinitiator has been used, then the deposited hybrid material acts as a negative tone photoresist, i.e., exposed regions becomes less soluble in a developer. The deposited material can be exposed with any suitable electromagnetic energy, though preferably having a wavelength from 13 nm to 706 nm, including DUV (210-280 nm), mid-UV (280-310 nm), standard I-line or G-line UV-light. DUV exposure is preferred. A stepper can be used for the UV exposure. Typically contact mask exposure techniques are applied. Exposure times may vary between 1 second to several hundred seconds. After the exposure the unexposed areas are removed by soaking the substrate/article (e.g., wafer) or otherwise exposing the substrate/article to a suitable developer (e.g., spray-development may also be used). A developer such as Dow Chemical DS2100, Isopropanol, methyl isobutyl ketone etc. or their combinations can be used to remove unexposed material. Typically 2 minutes development time is used and a solvent rinse (e.g., an ethanol rinse) is preferred to finalize the development. The rinsing removes development residues from the wafer. The adhesion of the exposed structures and the effectiveness of the exposure can be increased by heat-treating the article/substrate (e.g., a slow anneal at elevated temperature—typically less than 200 C). Other exposure techniques, such as exposure with a laser or with Deep UV, could also be performed in place of the above.

Post-baking process. The final hardening of the material is achieved by baking (in air, nitrogen, argon or helium) the article/substrate for several hours typically at less than 200 C Step-wise heating ramp-up and ramp-down are preferred. The material can also be fully or partially hardened with deep UV light curing.

In the alternative to the above, the material to be patterned is spun on, prebaked, hard baked (typically less than 200 C). Then standard photoresist and RIE etching techniques are applied.

Material Characteristics

Material processed and formed on a substrate as above, was tested to determine various characteristics of the deposited and cross linked material. In a test of the hydrophobicity of the hybrid material, a water contact angle measurement can be measured. The phenomenon of wetting or non-wetting of a solid by a liquid can be understood in terms of the contact angle. A drop of a liquid resting on a solid surface forming an angle relative to the surface may be considered as resting in equilibrium by balancing the three forces involved (namely, the interfacial tensions between solid and liquid, that between solid and vapor and that between liquid and vapor). The angle within the liquid phase is known the contact angle or wetting angle. It is the angle included between the tangent plane to the surface of the liquid and the tangent plane to the surface of the solid, at any point along their line of contact. The surface tension of the solid will favor spreading of the liquid, but this is opposed by the solid-liquid interfacial tension and the vector of the surface tension of the liquid in the plane of the solid surface.

In the present invention, contact angles of 90 degrees or more, and generally 100 degrees or more are easily achieved (from 50 ul of ultrapure water). Depending upon the compounds selected for hydrolysis/condensation, water contact angles of 125 degrees or more, or even 150 degrees or more can be achieved. Particularly if all organic groups, including those that provide bulk to the final material (e.g., a longer alkyl chain or a single or multi ring aryl group) as well as those that allow for cross linking (e.g., organic groups with unsaturated double bonds), are fully fluorinated—then the resulting material can be highly hydrophobic and result in very large contact angles. The hydrophobicity can easily be tailored depending upon which compounds are selected, and in what amounts, for hydrolysis/condensation.

Other properties of the materials, such as surface and sidewall roughness, feature size, aspect ratio, and glass transition temperature were also measured. The glass transition temperature, Tg, of the deposited materials was measured using a Mettler-Toledo Differential Scanning Calorimeter (DSC) and found to be 200 C or greater, and generally 250 C or greater (or even 310 C or more). Surface roughness, Rq, of the material (measured by atomic force microscopy and WYKO—white light interferometry) was found to be 10 nm or less, and generally 5 nm or less. In many cases, the surface roughness is 1 nm or less. When the material is patterned, sidewalls are formed in the surface topography that is created. A measurement of the sidewall roughness (measured by atomic force microscopy, SEM and WYKO—white light interferometry) was found to be 50 nm or less, and generally 10 nm or less. Depending upon the compounds used for hydrolysis/condensation, as well as exposure and development technique, a sidewall roughness, Rq, or 5 nm or less, or even 1 nm or less, can be achieved. Patterning of the material was able to create feature sizes (e.g., ridge or trench width) as small as 100 nm or less, or even 50 nm or less, as well as aspect ratios of such features of 2:1, 3:1 or even as high as 10:1 (also measured by atomic force microscopy, SEM and WYKO—white light interferometry).

Due to the hydrophobic nature of some of the materials within the present invention (e.g., those having a higher degree of fluorination), it may be desirable in some cases to first provide an adhesion promoting layer before depositing the hybrid material. For example, a 1:100 dilution of the material of the invention could be applied as an adhesion promoting layer before spinning on (or otherwise depositing) the hybrid material. The diluted SOD is very stable (photo, thermal, humidity, 85/85 tests) and easy to detect, spreads well on Silicon and is optically clear all the way to UV.

Other adhesion promoting materials that could be used include Onichem organosilane G602, (N (beta aminoethyl)-gamma aminopropyl dimethyl siloxane (CA 3069-29-2)— high boiling, high RI (1.454), thermally stable low density and is compatible with acrylics, silicones, epoxies, and phenolics), or Dow AP8000, propyloxysilane (e.g., 3(2 3 epoxy propoxy propyl)trimethoxy silane), Ormocer (low viscosity), Halar, Orion/Dupont Teflon primer, trifluoroacetic add, barium acetate, fluorethers (from Cytonix), PFC FSM 660 (a fluoroalkyl monosilane in a fluorinated solvent)—can be diluted to 0.1 to 0.05 percent in alcohol or fluorinated solvent, PFCFSM 1770 (a tri-fluoroalkyl monosilane in a fluorinated solvent, providing very low surface energy to oxide surfaces and good adhesion for fluoropolymers)—can be diluted to 0.1 to 0.05 percent in alcohol or fluorinated solvent, and/or HMDS.

The materials of the invention can be deposited as very thin layers (as thin as from 1 to 10 molecular layers), or in thicker films from 1 nm up to 100 um (or more). Generally, the material is deposited at a thickness of from 0.5 to 50 um, preferably from 1 to 20 um—though of course the thickness depends upon the actual use of the material. The thickness of the deposited layer can be controlled by controlling the material viscosity, solvent content and spinning speed (if deposited by spin on). Material thickness can also be controlled by adjusting the deposition temperature of both the deposition solution and the spinner (if spin on deposition). Also, adjusting the solvent vapor pressure and boiling point by selection of solvent can affect the thickness of the deposited material. Spin on deposition can be performed on a Karl Suss Cyrset enhanced RC8 spinner. Spray coating, dip-coating, meniscus coating, screen printing and "doctor blade" methods can also be used to achieve films of varying thickness.

As mentioned above, a preferred aspect of the present invention is the utilization of precursors having a single alkoxy, —Cl or —OH group that participates in the hydrolysis and cross linking in the process of making the dielectric of the invention.

Description. The synthesis of deposition materials is preferably based on hydrolysis and condensation of chlorosilanes (though alkoxysilanes, silanols or other hydrolysable precursors could be used). The synthesis procedure consists of five sequential stages: dissolve, hydrolysis, neutralization, condensation and stabilization. In the hydrolysis chlorine atoms are replaced with hydroxyl groups in the silane molecule. Hydrochloric acid formed in the hydrolysis is removed in the neutralization stage. Silanols formed in the hydrolysis are attached together for a suitable oligomer in the condensation stage. The extent of the condensation can be controlled with terminal groups, that is, silane precursors having multiple organic groups and a single hydrolysable (e.g., chlorine) group. Another advantage of terminal modified hybrid silanols is their stability against condensation. In addition, the material purification stability is improved since the evaporative purification can be done at slightly elevated temperatures without causing harmful post synthesis condensation.

Terminal groups. Compound of the general formula $R_1R_2R_3SiR_4$ can act as a terminal group, wherein $R_1$, $R_2$, $R_3$ are independently (non-fluorinated, partially fluorinated or perfluorinated) aromatic groups (e.g., phenyl, toluene, biphenyl, naphthalene, etc.) or cross linkable groups (e.g., vinyl, allyl, acrylate, styrene, epoxy etc.) or any alkyl group having from 1-14 carbons, wherein $R_4$ is either an alkoxy group, $OR^5$, or a halogen (Br, Cl). Perfluorinated $R_1$, $R_2$ and $R_3$ groups are preferred. Example method 1 for preparation of a deposition material with tris(perfluorovinyl)chlorosilane as a terminal group:

Dissolve. Tris(perfluorovinyl)chlorosilane, pentafluorophenyltrifluorovinyl dichlorosilane and pentafluorophenyltrichlorosilane are mixed together in molar ratio 1:4:4 in an appropriate reaction flask and the mixture is dissolved into appropriate solvent like tetrahydrofuran.

Hydrolysis and Co-condensation. The reaction mixture is cooled to 0° C. The hydrolysis is performed by adding water ($H_2O$) into the reaction mixture. The water is added as 1:4 (volume/volume) water-tetrahydrofuran-solution. The amount of water used is equimolar with the amount of chlorine atoms in the starting reagents. The reaction mixture is held at 0° C. temperature during the addition. The reaction mixture is stirred at room temperature for 1 hour after addition.

Neutralization. The reaction mixture is neutralized with pure sodium hydrogencarbonate. $NaHCO_3$ is added into cooled reaction mixture at 0° C. temperature (The amount of $NaHC_3$ added is equimolar with the amount of hydrochloric acid in the reaction mixture). The mixture is stirred at the room temperature for a while. After the pH of the reaction mixture has reached the value 7, mixture is filtered. The solvent is then evaporated with a rotary evaporator.

Condensation. The material is stirred with a magnetic stirrer bar under 12 mbar pressure for few hours. Water, which forms during this final condensation, evaporates off.

Stabilization. The material is dissolved into cyclohexanone, which is added 30 weight-% of the materials weight. The pH of the solution is adjusted to value 2.0 with acetic acid. Example method 2 for preparation of a deposition material with bis(pentafluorophenyl)trifluorovinylchlorosilane as a terminal group:

Dissolve. Bis(pentafluorophenyl)trifluorovinylchlorosilane, pentafluorophenyltrifluorovinyldichlorosilane and pentafluorophenyltrichlorosilane are mixed together in molar ratio 1:6:4 in an appropriate reaction flask and the mixture is dissolved into appropriate solvent like tetrahydrofuran. Hydrolysis, neutralization, condensation and stabilization stages are performed as in example method 1. Example method 3 for preparation of a deposition material with tris (perfluorotoluene)chlorosilane as a terminal group:

Dissolve. Tris(perfluorotoluene)chlorosilane, pentafluorophenyltrifluorovinyl-dichlorosilane and pentafluorophenyltrichlorosilane are mixed together in molar ratio 1:6:8 in an appropriate reaction flask and the mixture is dissolved into appropriate solvent like tetrahydrofuran.

Hydrolysis, neutralization, condensation and stabilization stages are performed as in example method 1.

Alternative Procedures for Each Stage

Dissolve. Instead of tetrahydrofuran (THF) as solvent you can use any pure solvent or mixture of solvents/alternate solvents are possible either by themselves or by combinations. Traditional methods of selecting solvents by using Hansen type parameters can be used to optimize these systems. Examples are acetone, dichloromethane, chloroform, diethyl ether, ethyl acetate, methyl-isobutyl ketone, methyl ethyl ketone, acetonitrile, ethylene glycol dimethyl ether, triethylamine, formic acid, nitromethane, 1,4-dioxane, pyridine, acetic acid, di-isopropyl ether, toluene, carbon disulphide, carbon tetrachloride, benzene, methylcyclohexane, chlorobenzene.

Hydrolysis. Water used in the reaction can be, instead of tetrahydrofuran, dissolved into pure or mixture of following solvents: acetone, dichloromethane, chloroform, diethyl ether, ethyl acetate, methyl-isobutyl ketone, methyl ethyl ketone, acetonitrile, ethylene glycol dimethyl ether, tetrahydrofuran, triethylamine, formic acid, nitromethane, 1,4-dioxane, pyridine, acetic acid. In the place of water following reagents can be used: deuterium oxide ($D_2O$) or HDO. A part of water can be replaced with following reagents: alcohols, deuterium alcohols, fluorinated alcohols, chlorinated alcohols, fluorinated deuterated alcohols, chlorinated deuterated alcohols. The reaction mixture may be adjusted to any appropriate temperature. The precursor solution can be added into water. Pure water can be used in the reaction. Excess or even less than equivalent amount of water can be used.

Neutralization. Instead of sodium hydrogen carbonate ($NaHCO_3$) neutralization (removal of hydrochlorid acid) can be performed using following chemicals: pure potassium, hydrogen carbonate ($KHCO_3$), ammonium hydrogen carbonate ($NH_4HCO_3$), sodium carbonate ($Na_2CO_3$), potassium carbonate ($K_2CO_3$), sodium hydroxide (NaOH), potassium hydroxide (KOH), calcium hydroxide ($Ca(OH)_2$), magnesium hydroxide ($Mg(OH)_2$) ammonia ($NH_3$), trialkylamines ($R_3N$, where R is hydrogen or straight/branched chain $C_xH_y$, x<10, as for example in triethylamine, or heteroatom containing as for example in triethanol amine), trialkyl ammonium hydroxides ($R_3NOH$, $R_3N$, where R is hydrogen or straight/branched chain $C_xH_y$, x<10), alkali metal silanolates, alkali metal silaxonates, alkali metal carboxylates. All neutralization reagents can be added into the reaction mixture also as a solution of any appropriate solvent. Neutralization can be performed also with solvent-solvent-extraction or with azeotropic water evaporation.

Procedure for solvent-solvent-extraction: The solvent is evaporated off after the hydrolysis. The material is dissolved into pure or mixture of following solvents: chloroform, ethyl acetate, diethyl ether, di-isopropyl ether, dichloromethane, methyl-isobutyl ketone, toluene, carbon disulphide, carbon tetrachloride, benzene, nitromethane, mehylcyclohexane, chlorobenzene. The solution is extracted several times with water or $D_2O$ until pH of the organic layer is over value 6. The solvent is then evaporated with rotary evaporator. In cases when water immiscible solvent has been used in hydrolysis stage then solvent-solvent extraction can be performed right after hydrolysis without solvent evaporation. Acidic or basic water solution can be used in the extraction.

Procedure for azeotropic water evaporation: The solvent is evaporated off after the hydrolysis. The material is dissolved into mixture of water and one of the following solvents (1:10 volume/volume): tetrahydrofuran, ethanol, acetonitrile, 2-propanol, tert-butanol, ethylene glycol dimethyl ether, 2-propanol, toluene, dichloromethane. The formed solution is evaporated to dryness. The material is dissolved again into the same mixture of water and the solvent. Evaporation and addition cycle is repeated until pH value of the material solution is 7. The solvent is then evaporated with rotary evaporator.

Condensation. The pressure in this stage can be in a large range. The material can be heated while vacuum treatment.

Molecular weight of formed polymer can be increased in this stage by using base or acid catalyzed polymerizations. Procedure for acid catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of add such as: triflic acid, monofluoro acetic acid, trifluoro acetic add, trichloro acetic add, dichloro acetic acid, monobromo acetic acid. The solution is refluxed for few hours or until polymerization is reached desired level while water formed in the reaction is removed. After polymerization, add catalyst is removed from the material solution completely for example using solvent extraction or other methods described in alternative neutralization section. Finally solvent is removed. Procedure for base catalyzed polymerization: Pure material is dissolved into any appropriate solvent such as: tetrahydrofuran, ethanol, acetonitrile, 2-propanol, tert-butanol, ethylene glycol dimethyl ether, 2-propanol, toluene, dichloromethane, xylene, chloroform, diethyl ether, ethyl acetate, methyl-isobutyl ketone. Into the solution material solution is added catalytic amount of base such as: triethanol amine, triethyl amine, pyridine, ammonia, tributyl ammonium hydroxide. The solution is refluxed for few hours or until polymerization is reached desired level while water formed in the reaction is removed. After polymerization, base catalyst is removed from the material solution completely for example by adding acidic water solution into the material solution. After that acidic solution is neutralized using solvent extraction or other methods described in alternative neutralization section. Finally, solvent is removed.

Stabilization. In the place of THF and cyclohexanone can be used pure or mixture of following solvents: cyclopentanone, 2-propanol, ethanol, methanol, 1-propanol, tetrahydrofuran, methyl isobutyl ketone, acetone, nitromethane, chlorobenzene, dibutyl ether, cyclohexanone, 1,1,2,2-tetrachloroethane, mesitylene, trichloroethanes, ethyl lactate, 1,2-propanediol monomethyl ether acetate, carbon tetrachloride, perfluoro toluene, perfluoro p-xylene, perfluoro iso-propanol, cyclohexanone, tetraethylene glycol, 2-octanol, dimethyl sulfoxide, 2-ethyl hexanol, 3-octanol, diethyleneglycol butyl ether, diethyleneglycol dibutyl ether, diethylene glycol dimethyl ether, 1,2,3,4-tetrahydronaphtalene or trimethylol propane triacrylate. The material solution can be acidified using following acids: acetic add, formic acid, propanoic add, monofluoro acetic acid, trifluoro acetic acid, trichloro acetic acid, dichloro acetic acid, monobromo acetic add. Also following basic compounds can be added into the material solution: triethyl amine, triethanol amine, pyridine, N-methyl pyrrolidone.

Stabilization in cases when the condensation stage is passed: Acetic add is added into the mixture until pH value is 3-4. The solution is evaporated until appropriate concentration of the oligomer in the solution has reached (about 50 w-% oligomer, 49 w-% solvent and 1 w-% acid, solvent is the solvent of the dissolve and hydrolysis stages).

Initiators: Photoinitiators that can be used are Irgacure 184, Irgacure 500, Irgacure 784, Irgacure 819, Irgacure 1300, Irgacure 1800, Darocure 1173 and Darocure 4265. The initiator can be highly fluorinated, such as: 1,4-bis(pentafluorobenzoyl)benzene or Rhodosil 2074 or other suitable initiator. Thermal initiators which can be used are benzoyl peroxide, 2,2'-azobisisobutyronitrile, 1,1'-Azobis(cyclohexanecarbonitrile), tert-butyl hydroperoxide, Dicumyl peroxide and Lauroyl peroxide.

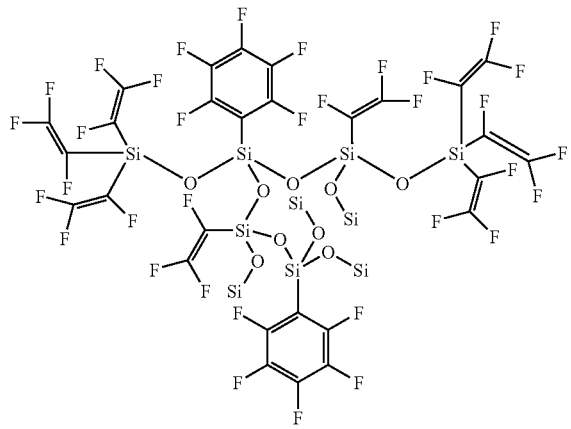

Figure above: Example of oligomeric molecule formed in above type of reactions. (Of course this is but one of many examples of materials formed after hydrolysis of precursors).

Alternatively in all previous cases also perfluorinated solvents can be applied such as compounds: perfluorinated alkanes [F(CF$_2$)$_n$F, where n=6-10], fluorinated or partially fluorinated alcohols [F(CF$_2$)$_n$—OH, n=3-10], perfluoroaromatic compounds (e.g. hexafluorobenzene, pentafluorophenol, pentafluoronitrobenzene, perfluoro(m-xylene), perfluoro(p-xylene), perfluorotoluene) and other perfluorinated ring structures [e.g. perfluoro-(methylcyclohexane), perfluorodecalin, perfluoro(methyldecalin), perfluoro(1-methylcyclopentene)].

In the all embodiments of above one at least on of the precursors can be preplaced with with so called multisilanes to modify the matrix. Present invention describes material category that can be applied to obtain low optical loss and low stress thin films and components as well as low-k dielectric materials for integrated circuit applications. This can be obtained by placing organic moieties between two trichloro- or trialkoxy-metalloid end groups.

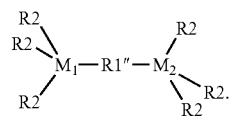

Organobis(tricholoro)metalloid

Where M$_1$=M$_2$=silicon, germanium, zirconium or titanium; M$_1$, M$_2$=silicon, germanium, zirconium or titanium; R2 is methoxy, ethoxy, propoxy, chlorine or bromine and R1 perfluorinated or partially fluorinated alkyl (C1-C10), branched perfluorinated or partially fluorinated alkyl, perfluoro or partially fluorinated phenyl, perfluoro or partially fluorinated biphenyl, perfluoro or partially fluorinated naphthalene, 1,2-perfluorotoluene, 1,3perfluorotoluene, 1,2-perfluorostyrene, 1,3-perfluorostyrene.

In one embodiment of the invention, a multisilane is hydrolysed to obtain a hybrid organic-inorganic siloxane matrix (if silicon is M1 and M2). In another embodiment of the invention, a multisilane is hydrolysed along with an additional silane having one or two organic groups bound to a core metal or metalloid. For example, the additional silane could be a tetralkoxysilane, a trialkoxysilane or a dialkoxysilane if the multisilane is an alkoxysilane. Or, if the multisilane is a halosilane (e.g. a chloro or bromo-silane), then the additional silane could be a trichlorosilane or dichlorosilane. Additional silanes could be those such as set forth in Exhibit A attached hereto.

After hydrolysis and condensation, obtained metaloxide matrix is more flexible, i.e. low stress, as well as causes lower optical attenuation loss compared to network obtained with sol-gel methods, since bis(trifunctional metaloids) are linking metaloxide backbones to each other. These kinds of materials present hydrophobic property and high stability.

Other examples include:

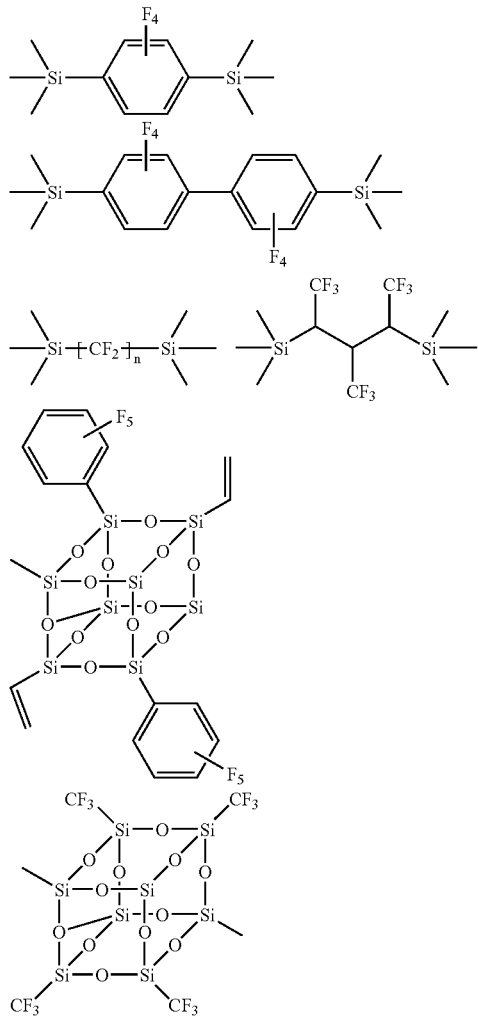

As mentioned above in relation to the appended Figures, the hydrolyzed and condensed material is mixed with a solvent (this can be a fluorinated solvent) and deposited (by spin-on, spray-on, dip coating, etc) on a substrate. Often the substrate will be a silicon substrate on which have been formed electronic circuitry (including p and n type regions) and on which may optionally be one or more layers of alternating regions of electrically insulating and electrically conducting materials (e.g for vias and interconnects). Thus, the substrate of the invention may be a silicon wafer, doped or not, with or without subsequent films or layers thereon. Of course, the invention is not limited to silicon substrates, as any suitable substrate, semiconductor or not (glass, quartz, SOI, germanium etc) can be used depending upon the desired final product. Often the hybrid material of the invention will be deposited in a particular layer and patterned (e.g. by RIE or by cross linking and developing if there is a cross linkable group in the material) after which an electrically conductive material (such as aluminum or copper or alloys of these or other electrically conductive materials as known in the art) is deposited in areas where the electrically insulating material has been removed, followed if desired by chemical mechanical polishing down to the level of the electrically insulating material. It is also possible to deposit and pattern the electrically conductive material first, though deposition after the insulating material is preferred. Capping layers can be deposited prior to depositing the electrically conductive material to provide a chemical mechanical polishing stop. Barrier layers can also be deposited to prevent the electrically conductive material from physically or chemically passing into or reacting with the electrically insulating material. Also hard masks can be deposited for providing a via etch stop. Adhesion promoting layers can be desirable to improve adhesion of some of the more highly fluorinated hybrid materials of the invention. Such adhesion promoting layers can be non (or low) fluorinated materials in accordance with the invention or other adhesion promoting layers as known in the art. Primers can be deposited for example between the electrically conductive layer and the dielectric layer, between two dielectric layers, between a capping layer and a dielectric layer or between a hard mask and a dielectric layer. Primers and coupling agents are typically liquids that may be applied to adhered surfaces prior to the adhesive or coating, or particularly prior to spin-on dielectric film deposition. Such primers can be desirable for a number of reasons, including i) a coating of primer applied to a freshly prepared surface serves to protect it until the bonding operation is carried out, ii) primers wet the surface more readily that the coating. This may be achieved by using, as the primer the coating dissolved in a solution of much lower viscosity. Alternatively, it may be a solution of a different polymer, which after drying is easily wetted by the coating, iii) a primer may serve to block a porous surface, thus preventing escape of the coating. With structural coating binds this is probably only important for porous layers underneath of it. However, some penetration of the coating may be very desirable and viscosity can be adjusted to give optimum penetration, iv) a primer can act as the vehicle for corrosion inhibitors, keeping such inhibitors near the surface where they are needed, v) the primer may be a coupling agent capable of forming chemical bonds both with the adhered surface and the coating, and vi) the adsorption of the primer to the substrate may be so strong that, instead of merely being physically adsorbed, it has the nature of a chemical bond. Such adsorption is referred to as chemisorption to distinguish it from the reversible physical adsorption. The primers and coupling agents may also be deposited from a gas phase. Primer examples include 3-aminopropyl triethoxysilane, 3-aminopropyl trimethoxysilane, 3-glysidoxypropyl trimethyoxysilane, vinyl triethoxysilane and 3-thgiopropyl triethoxysilane.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

We claim:

1. A method for making an integrated circuit comprising forming alternating areas of electrically conductive and dielectric materials, the dielectric materials formed by hydrolysing, partially or fully, one or more precursors, at least one of which having the formula (I):
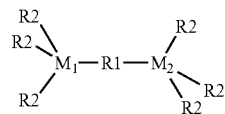
(I)
where R2 is a halogen, —OH, or alkoxy group, where M1 and M2 are independently a metal or metalloid, and where R1 is a fully or partially fluorinated alkyl group having from 1 to 10 carbon atoms or a fully or partially fluorinated aromatic group.
* * * * *